United States Patent [19]

Kronlage

[11] 4,227,185

[45] Oct. 7, 1980

[54] SINGLE CHIP INTEGRATED ANALOG-TO-DIGITAL CONVERTER CIRCUIT POWERED BY A SINGLE VOLTAGE POTENTIAL

[75] Inventor: John W. Kronlage, Richardson, Tex.

[73] Assignee: Texas Instruments Incorporated, Dallas, Tex.

[21] Appl. No.: 964,774

[22] Filed: Nov. 29, 1978

Related U.S. Application Data

[63] Continuation of Ser. No. 744,019, Nov. 22, 1976, abandoned.

[51] Int. Cl.³ .................... G01K 7/00; H03K 13/02; H03K 13/20
[52] U.S. Cl. .................... 340/347 NT; 73/362 AR; 324/99 D; 340/347 M; 340/347 CC
[58] Field of Search .... 340/347 M, 347 NT, 347 AD, 340/347 CC; 324/99 D; 73/359, 362 AR

[56] References Cited

U.S. PATENT DOCUMENTS

| | | | |
|---|---|---|---|
| 3,620,082 | 11/1971 | Peters | 340/347 NT X |
| 3,654,560 | 4/1972 | Cath et al. | 340/347 CC X |
| 3,701,142 | 10/1972 | Cannara | 340/347 AD X |
| 3,701,145 | 10/1972 | Bergin | 235/310 X |

OTHER PUBLICATIONS

Hart et al., Bipolar LSI Takes A New Direction—, Electronics, 10/3/74, pp. 111–118.
Grandbois, Improved Linear Processing–, Electronics, 6/27/74, pp. 93–101.
Mattera, Converter Stresses Stability, Electronics, 2/19/76, pp. 139, 140.

*Primary Examiner*—Thomas J. Sloyan
*Attorney, Agent, or Firm*—Stephen S. Sadacca; Mel Sharp

[57] ABSTRACT

A novel analog-to-digital converter is integrated on a semiconductor substrate utilizing I²L techniques. The resulting converter, which utilizes dual slope integration to generate a digital signal, operates from a single low-voltage power supply and has few external components. The converter is suitable for integration with I²L digital circuitry to provide a complete digital system, which operates in accordance with an analog input signal, on a single semiconductor chip.

20 Claims, 24 Drawing Figures

| Fig.2a | Fig.2b | Fig.2c | Fig.2d |
| --- | --- | --- | --- |
| Fig.2e | Fig.2f | Fig.2g | Fig.2h |
| Fig.2i | Fig.2j | Fig.2k | Fig.2l |
| Fig.2m | Fig.2n | Fig.2o | Fig.2p |

Fig.2

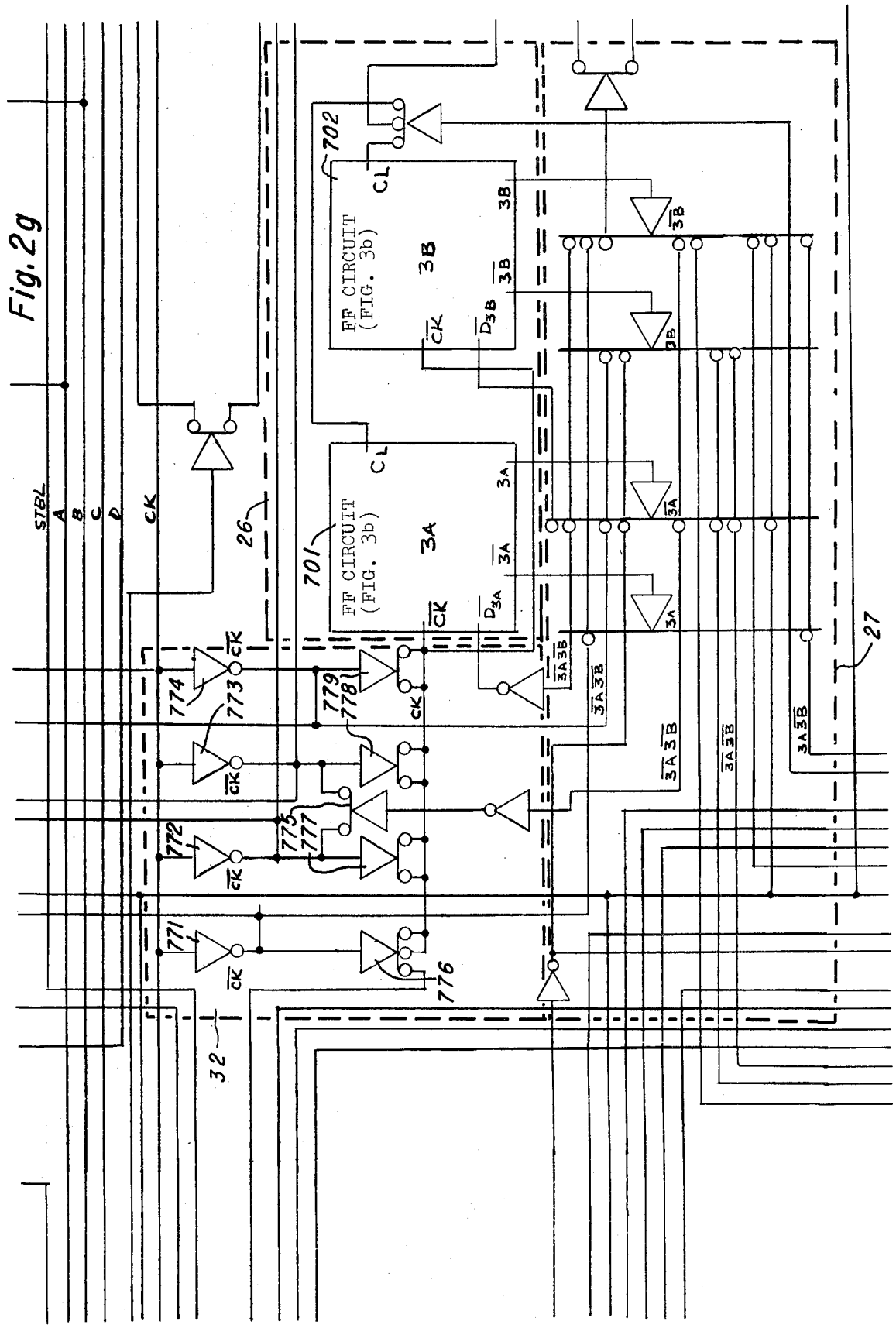

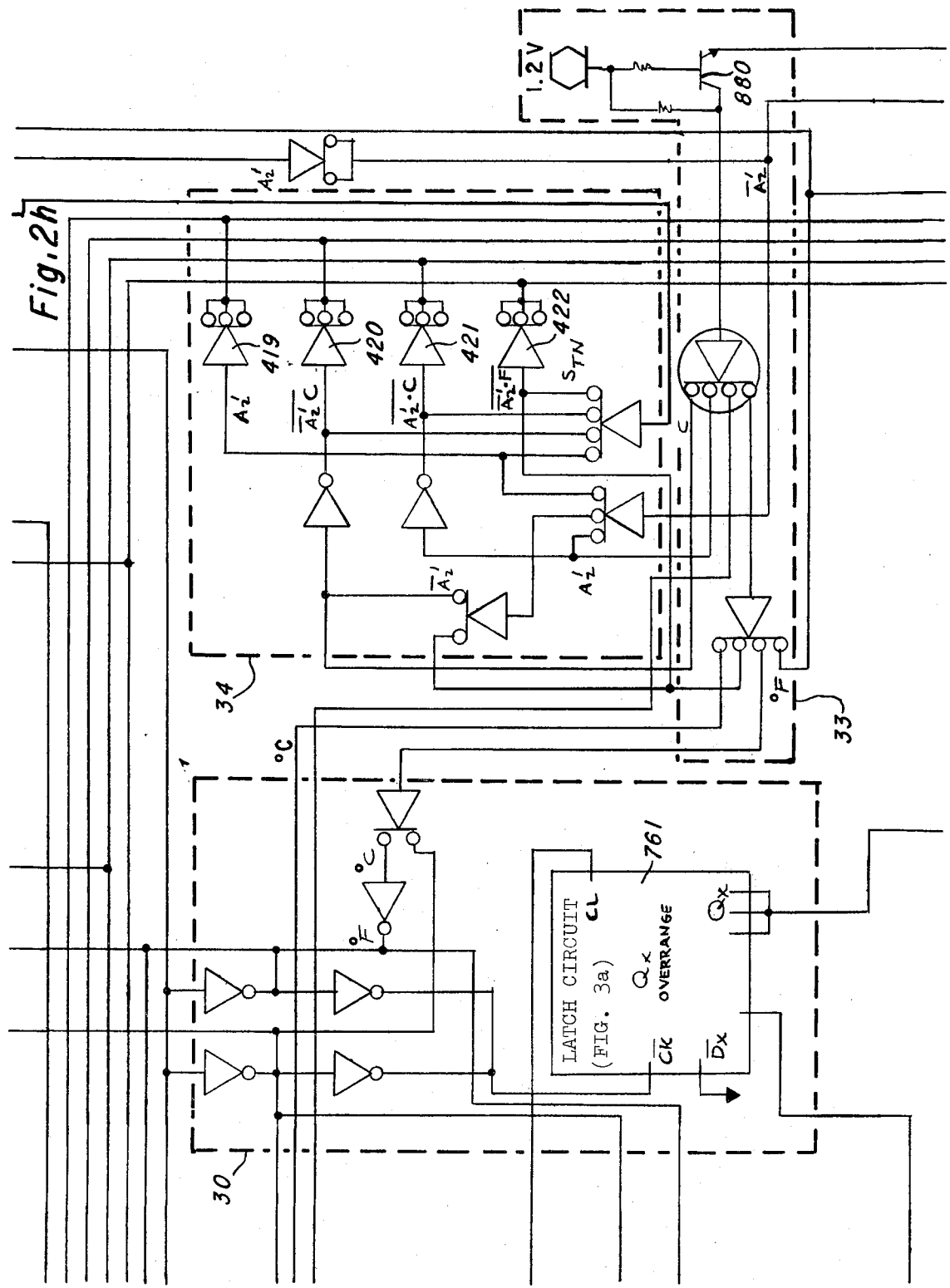

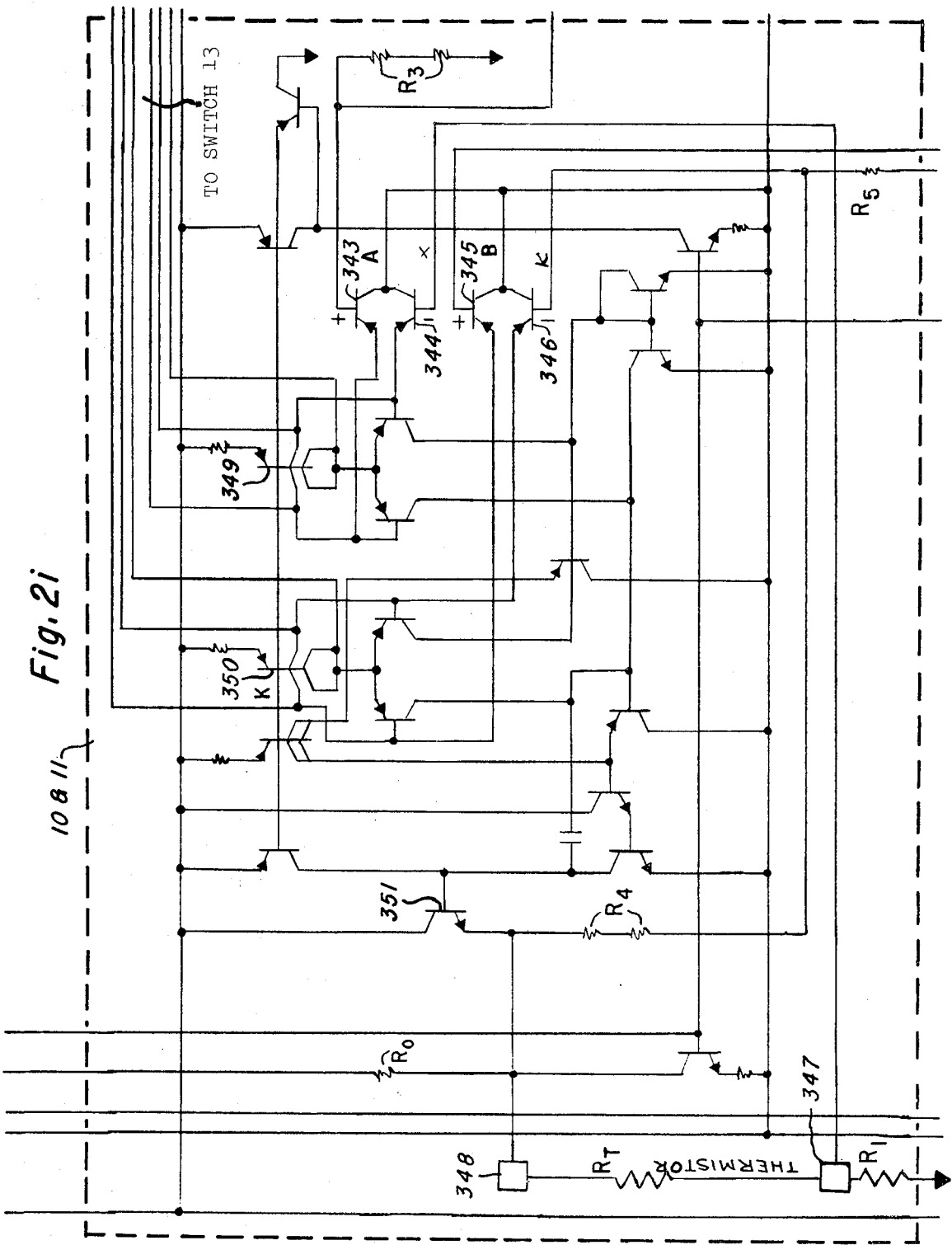

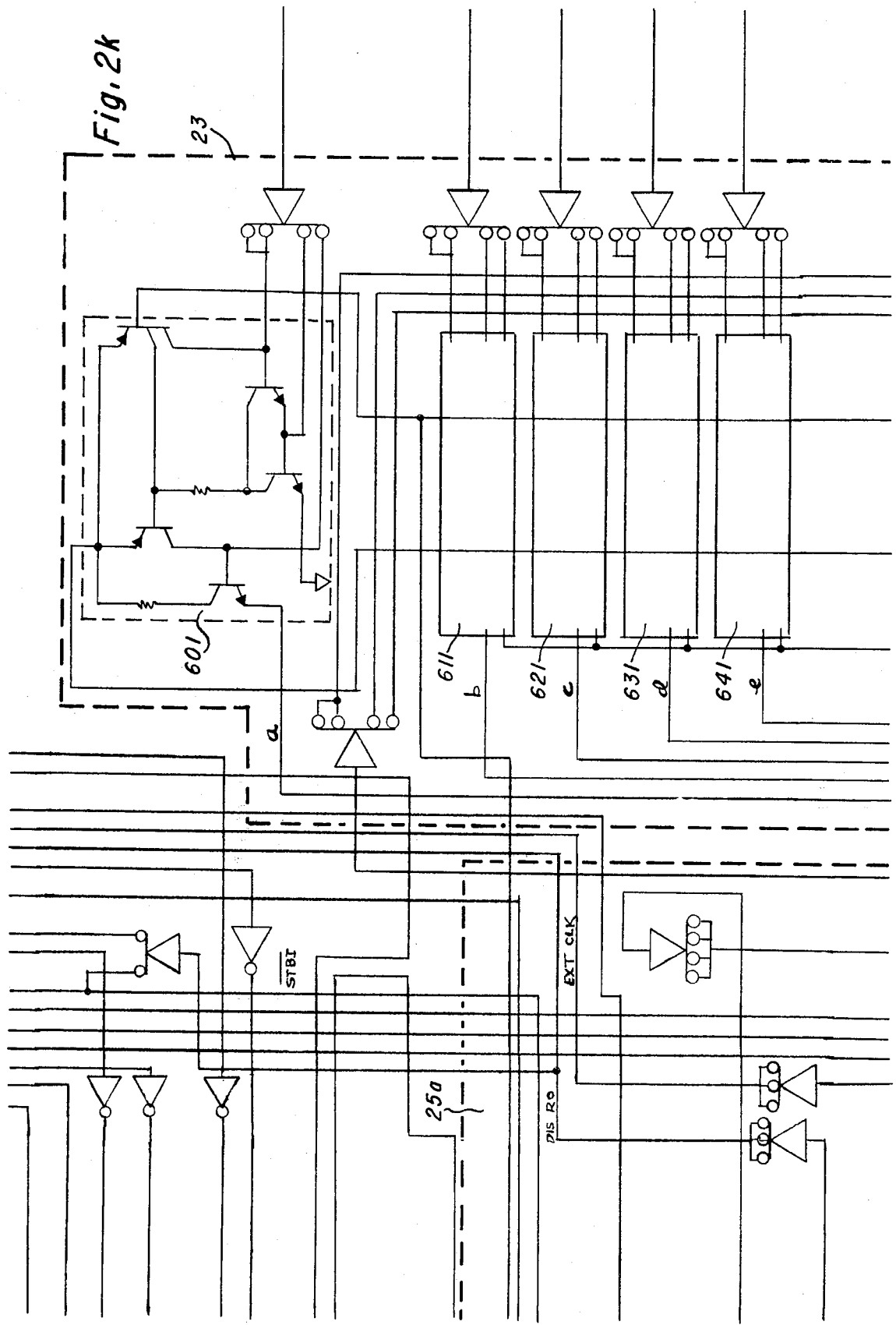

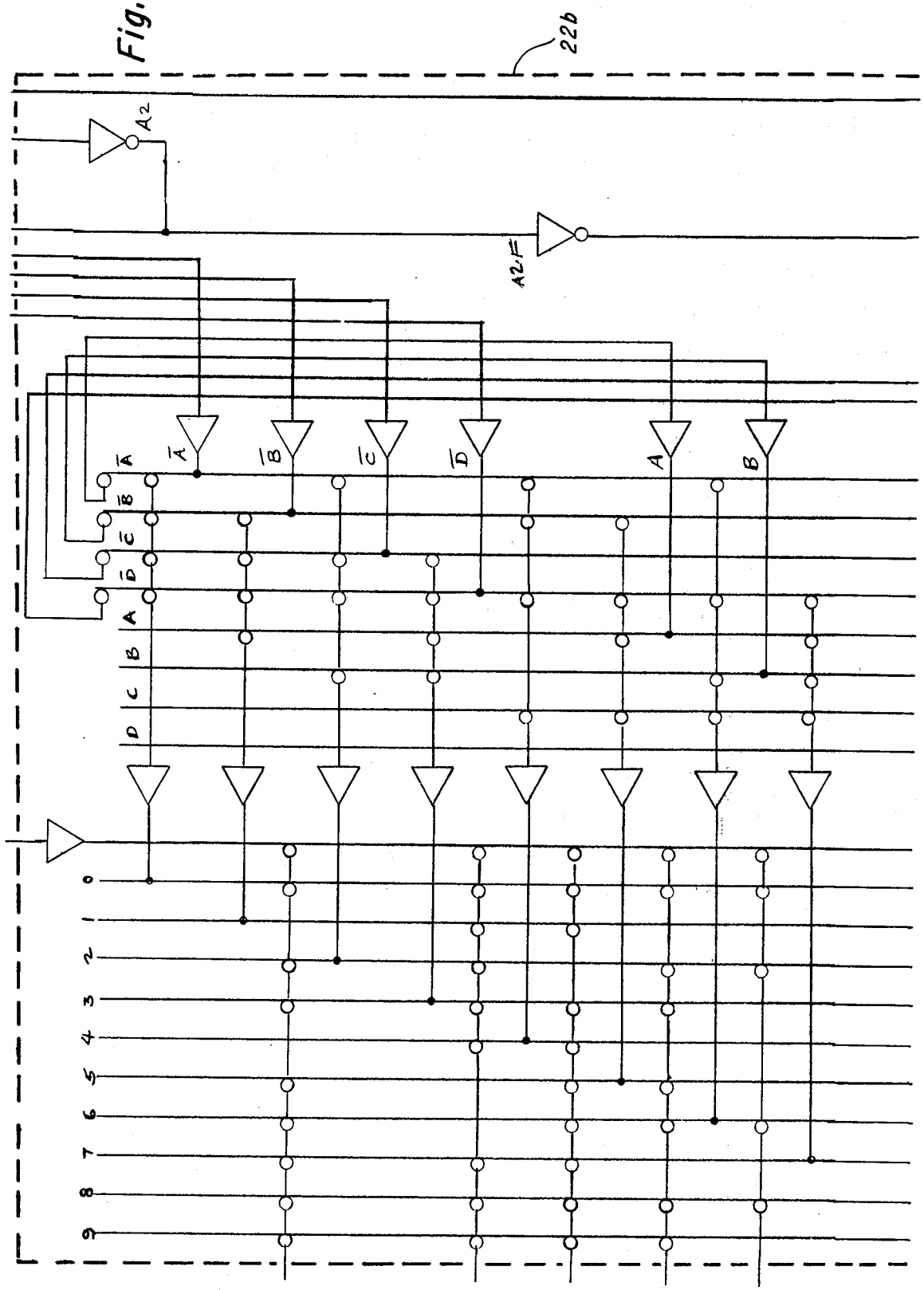

SINGLE CHIP INTEGRATED ANALOG-TO-DIGITAL CONVERTER CIRCUIT POWERED BY A SINGLE VOLTAGE POTENTIAL

This is a continuation, of application Ser. No. 744,019, filed Nov. 22, 1976, now abandoned.

BACKGROUND OF THE INVENTION

This invention relates to analog-to-digital converters, and more particularly, to analog-to-digital converters which are capable of being integrated as a semiconductor circuit.

Dual slope analog-to-digital converters divide the modes within a conversion sequence into three equal time periods of magnitude equal to the time required to count through all the states of a digital counter. The first time period is devoted to zeroing the system; the second time period is devoted to integration with the analog voltage, representing the measured parameter, switched into the circuit; and, the third time period devoted to integration with the analog reference voltage, representing full scale of the measured parameter, switched into the circuit. Conventionally, during the first time period, the storage element; ie, a capacitor, is discharged to 0 volts; during the second and third time periods, the measured parameter voltage is compared to the full scale reference voltage and the results latched in digital form which may be stored, displayed and/or utilized for some other desired purpose.

Conventional analog-to-digital converters of this type are implemented utilizing two or more separate integrated circuits and several external components. In addition, two or three power supply voltages are generally required for operation; e.g., +5 volts, +15 volts and −15 volts.

It is therefore an object of the present invention to provide an improved analog-to-digital converter.

Another object of the invention is to provide an analog-to-digital converter which is capable of being integrated on a single semiconductor substrate with few external components.

A further object of the invention is to provide an analog-to-digital converter which operates from a single relatively low-voltage, low-power supply.

It is another object of the invention to provide an analog-to-digital converter which is capable of being integrated as a semiconductor circuit utilizing I$^2$L techniques.

Still a further object of the invention is to provide an analog-to-digital converter which is integratable on a single substrate with digital circuitry to provide a complete analog and digital system on a single semiconductor chip.

Yet another object of the invention is to provide an analog input stage for a portable, battery-operable digital thermometer.

BRIEF DESCRIPTION OF THE INVENTION

These and other objects are accomplished in accordance with the present invention in which an analog-to-digital converter is integrated on a semiconductor substrate utilizing I$^2$L techniques. The converter which operates from a single low-voltage, low-power supply (e.g., +5 volts $V_{CC}$), utilizes dual slope integration to generate a digital signal. The converter has as few as two external components, an integration capacitor and one or more analog input gain-setting resistors.

More particularly, in a preferred embodiment thereof, a stable reference voltage, the output of which does not vary significantly under a wide range of external conditions such as ambient temperature variations, is utilized. It is contemplated that a ratiometric version may be provided in which a varying reference voltage is provided by the same power supply which provides the operating voltage $V_{CC}$. A scaling amplifier utilizes the reference voltage and suitable networks to derive a voltage $V_A$ which is a suitable representation of the analog parameter to be measured. A reference amplifier utilizes the reference voltage and suitable networks to derive a voltage $V_B$ representative of the full scale value of the parameter to be measured. An analog switch allows either the voltage $V_A$ or the voltage $V_B$ to be applied to the integrator input upon action of an electronic enabling signal. An integrator produces a ramp voltage in one direction when $V_A$ is applied, and produces a ramp voltage in the opposite direction when $V_B$ is applied. A comparator produces a logical transition when the integrator ramp voltage crosses a threshold voltage in either direction; this transition triggers a latch or other suitable storage means.

BRIEF DESCRIPTION OF THE DRAWINGS

Still further objects and advantages of the invention will be apparent from the detailed description and claims when read in conjunction with the accompanying drawings, wherein:

DETAILED DESCRIPTION OF THE PREFERRED EMBODIMENTS

Figure 1C:
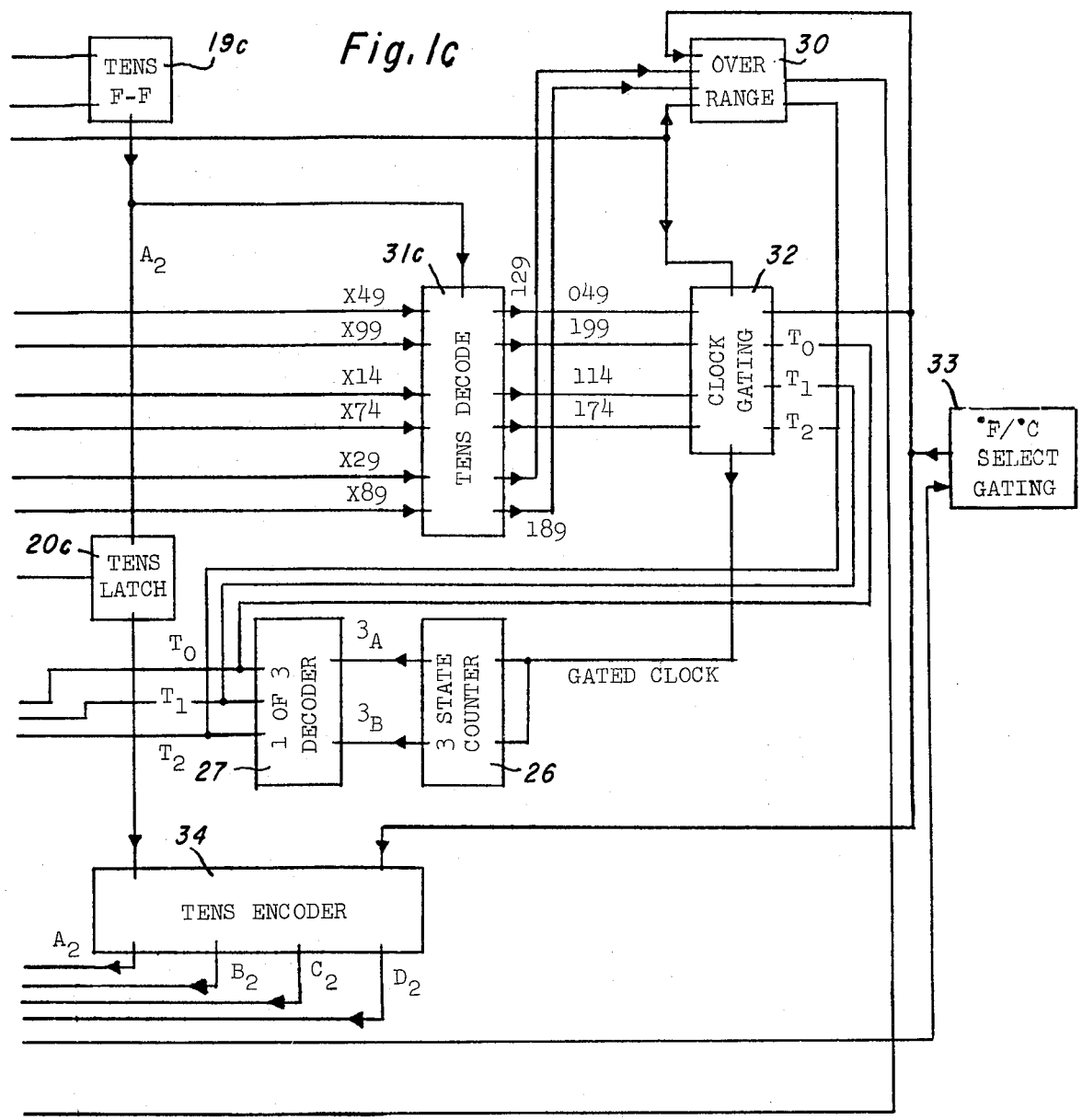
FIGS. 1a–1c, when assembled according to the composite of FIG. 1, embodying the present invention.
Figure 1:
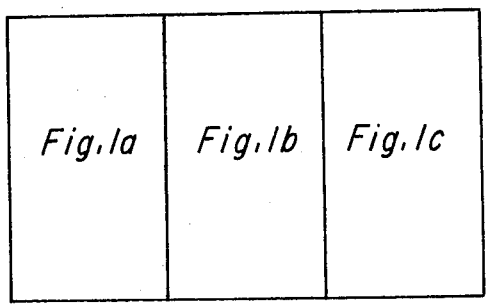
Figure 1A:
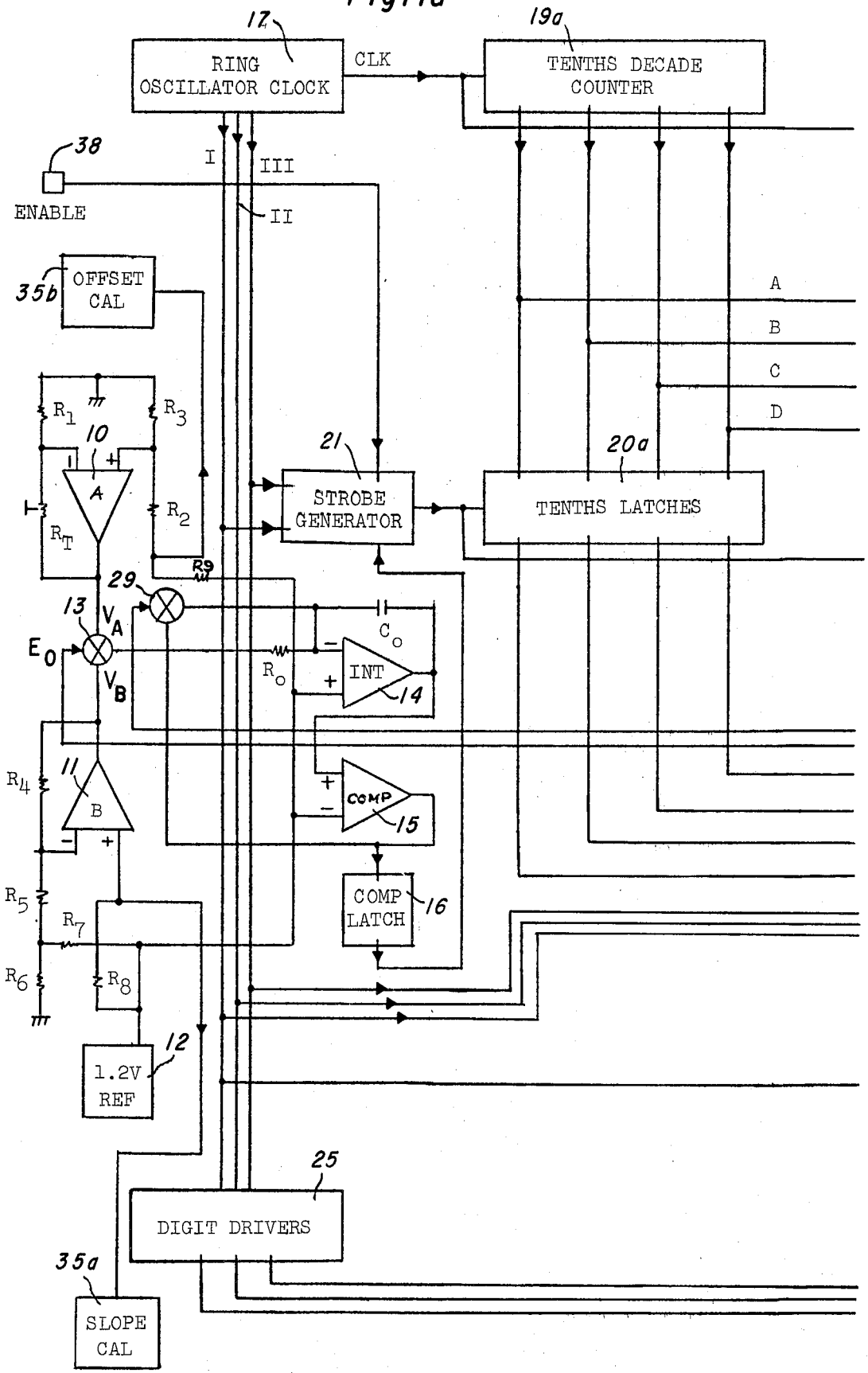
Figure 1B:
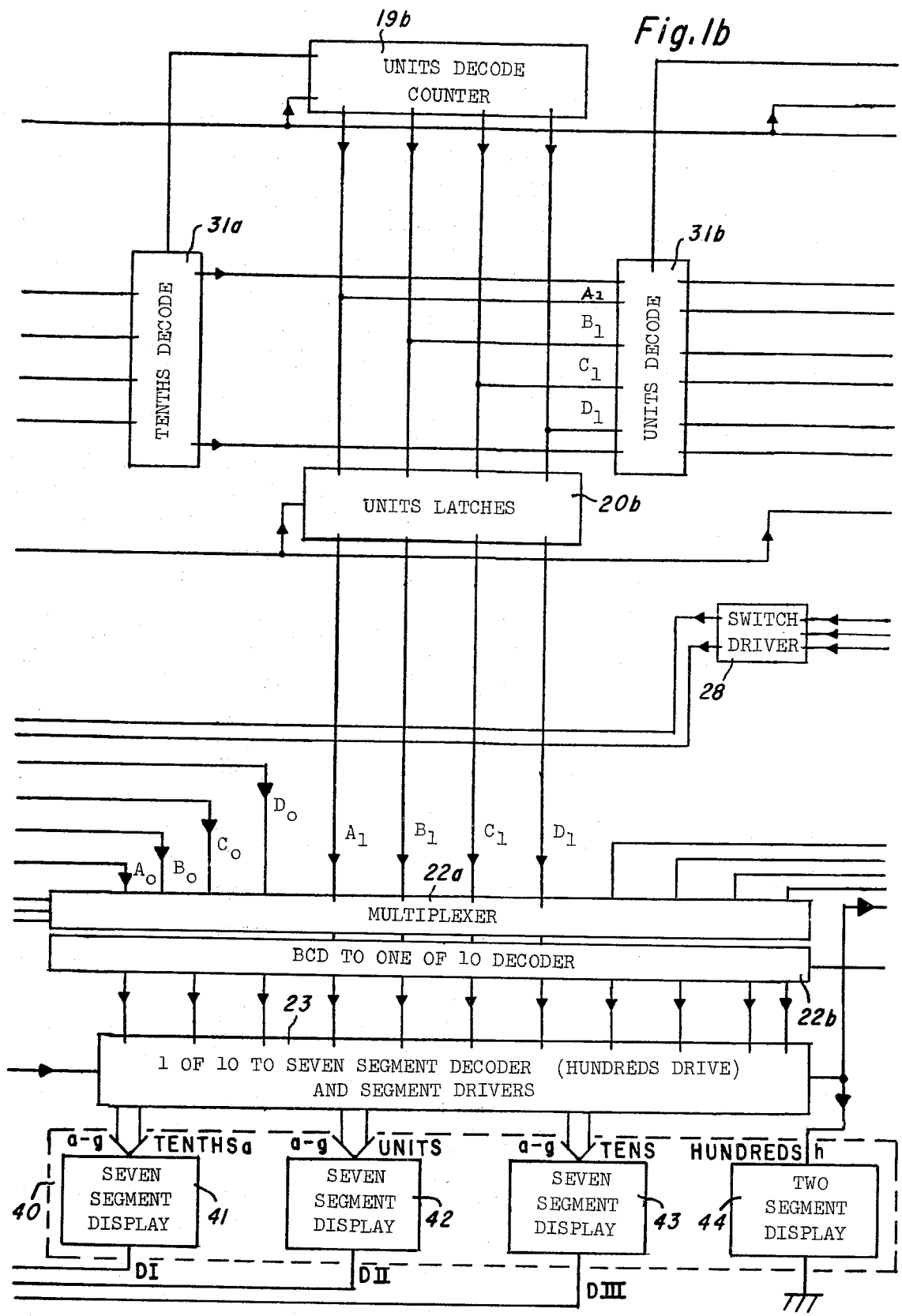

Referring then to the drawings, and in particular to FIGS. 1a–1c, a unique digital thermometer is illustrated in which the present invention is embodied and comprises a novel feature thereof. The digital thermometer is integrated on a single semiconductor substrate, utilizing I$^2$L fabrication techniques, with the exception of a few external components; such as, a thermistor or other suitable temperature-sensitive device, LED or other suitable display elements, an integration capacitor and an analog input gain-setting resistor.

The digital thermometer is comprised of two sections; an analog section which measures and converts an analog signal representative of temperature to an appropriate digital signal and a digital section which stores, decodes and digitally displays the digital signal to provide a visible temperature reading.

Figure 2A:
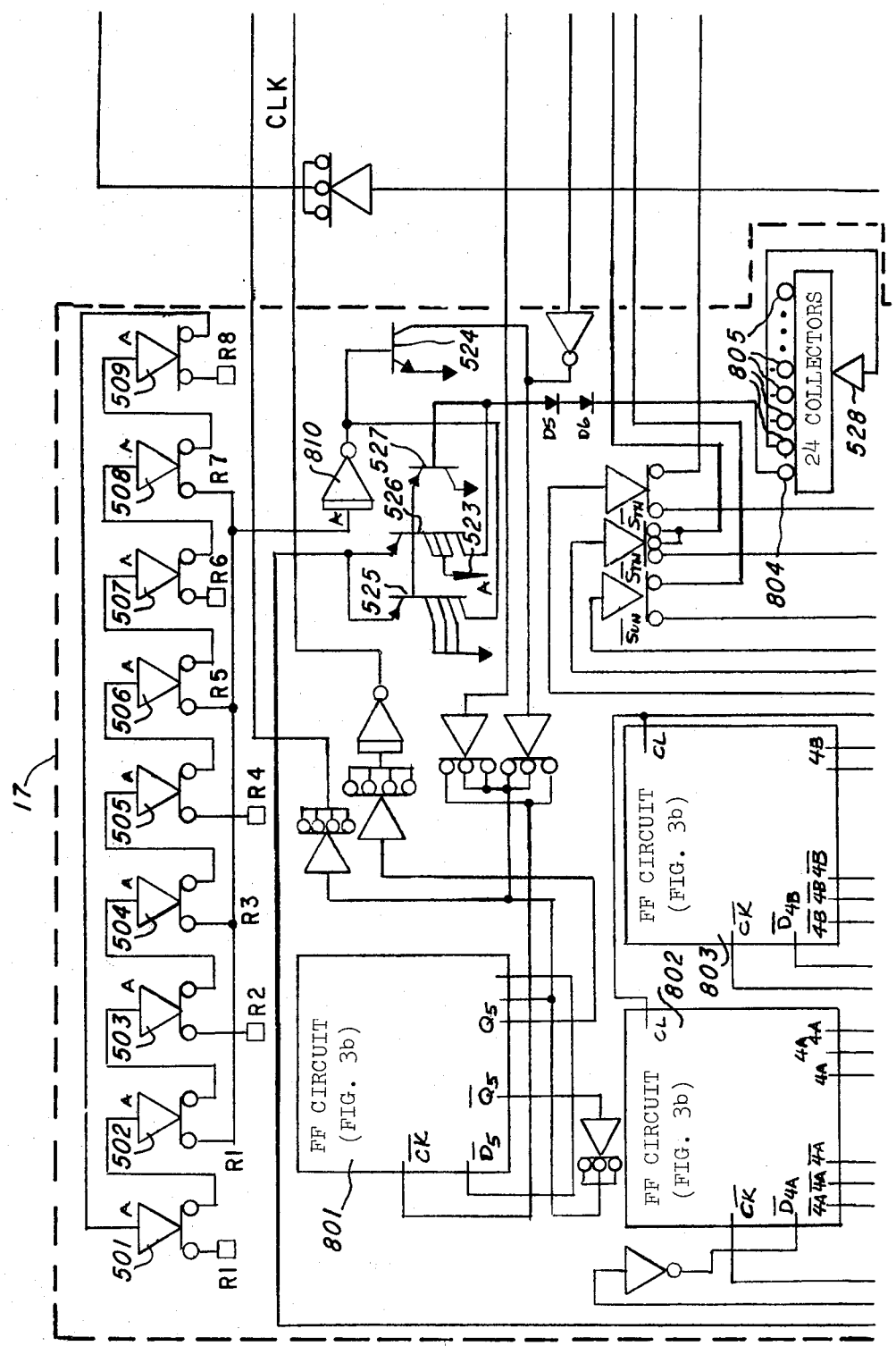
FIGS. 2a–2p, when assembled according to the composite of FIG. 2, form a detailed circuit diagram of the digital thermometer of FIGS. 1a–1c.
Figure 2B:
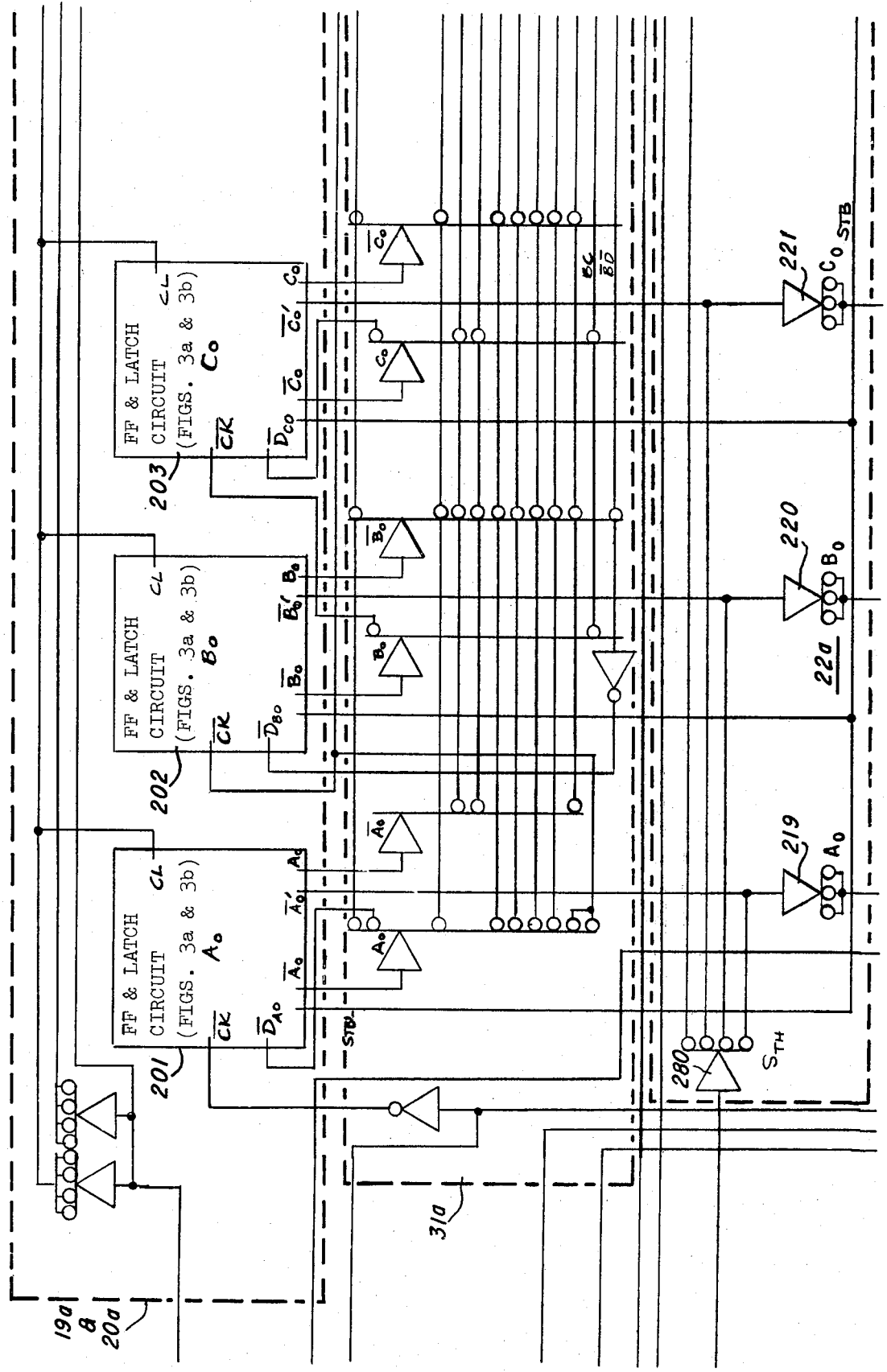
Figure 2C:
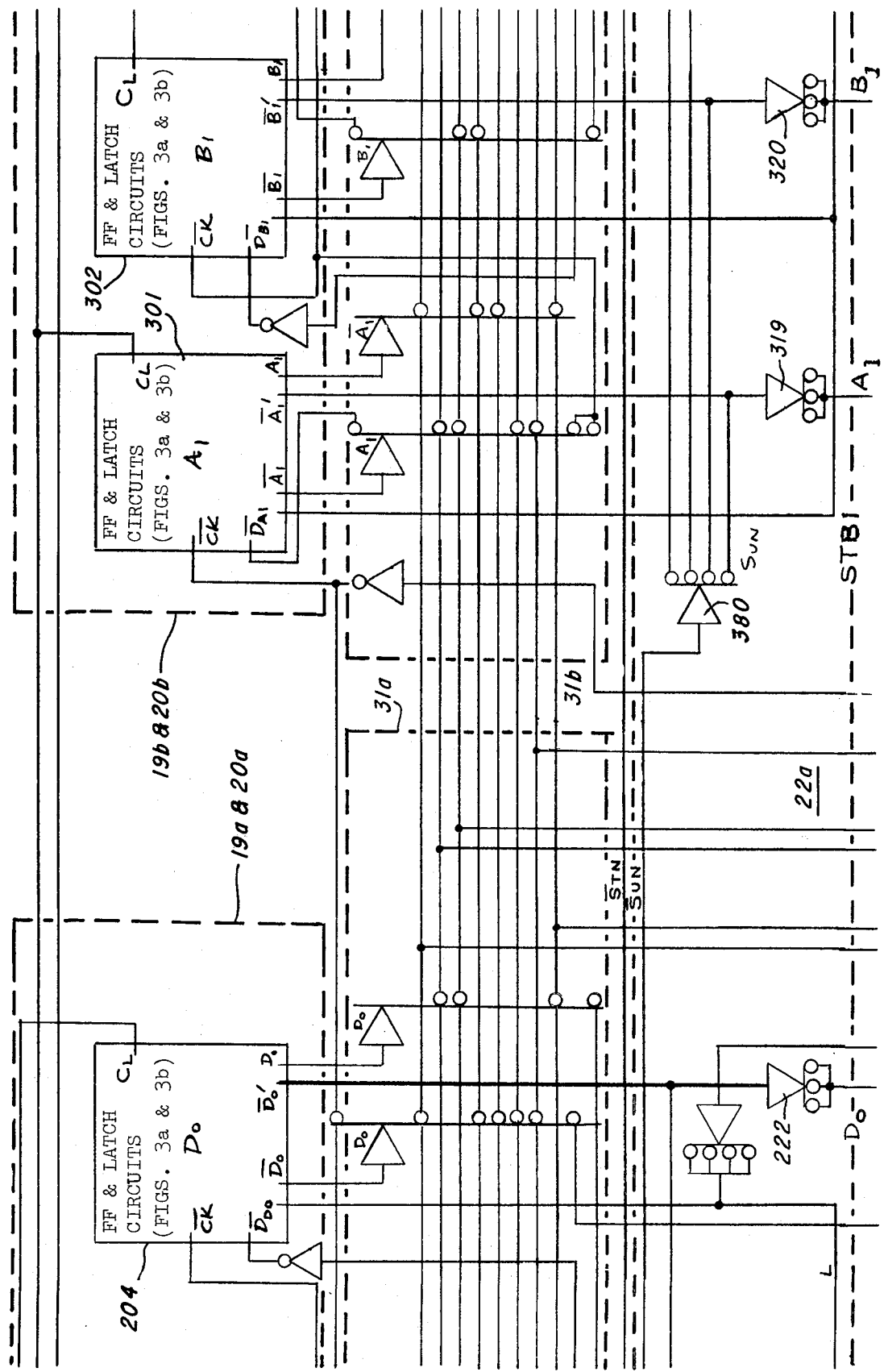
Figure 2D:
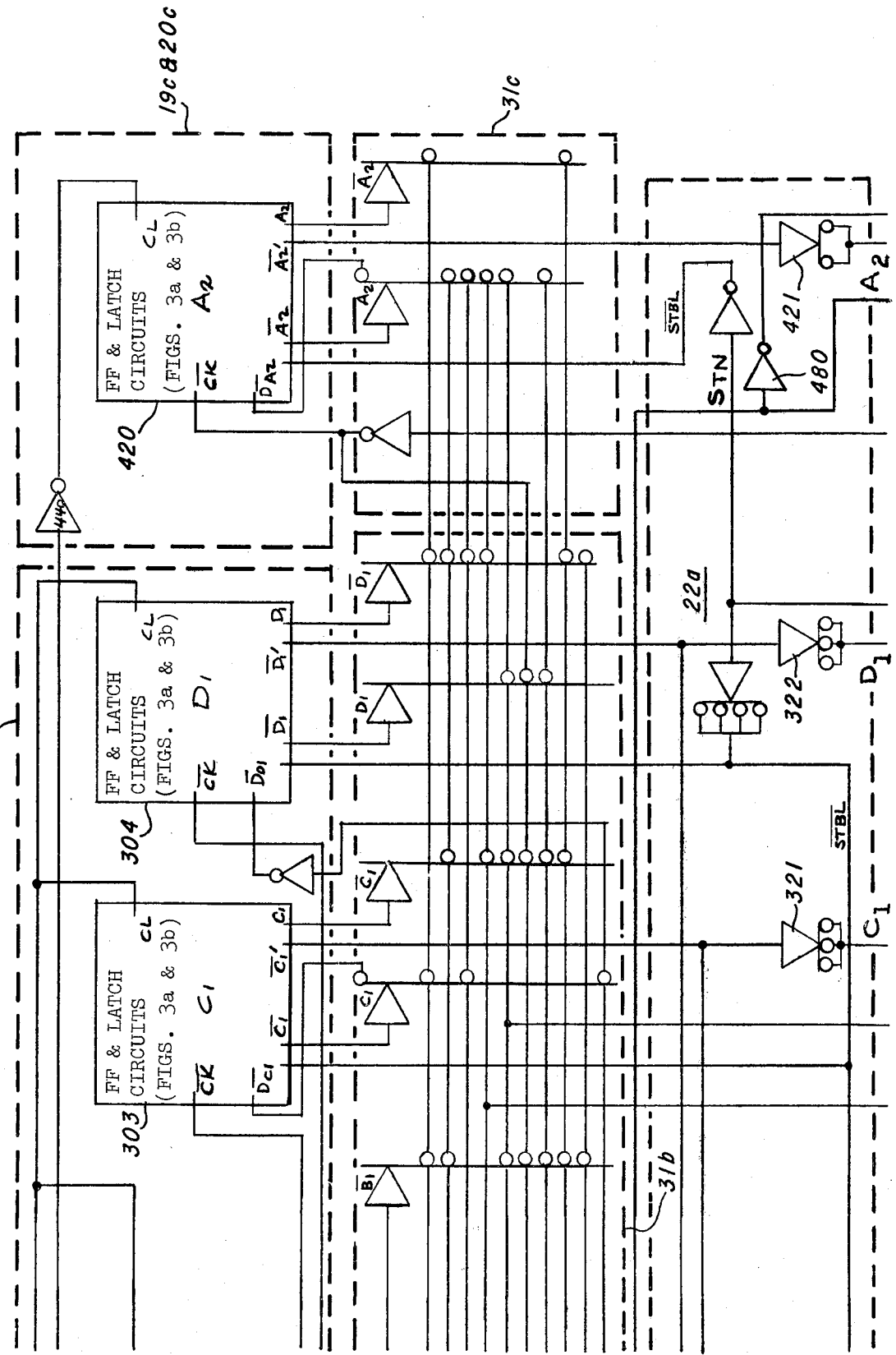

The analog section is comprised of an analog-to-digital converter which utilizes dual slope integration. The analog-to-digital converter is able to reject unwanted components of signals such as 60-Hz pickup. A stable voltage reference $V_{REF}$ is provided to the analog-to-digital converter by voltage regulator 12, the output of which does not vary significantly under a wide range of conditions; such as, ambient temperature variations or variations in a battery voltage supply ($V_{CC}$). The voltage regulator 12, shown in greater detail in FIG. 2m, is described in detail and claimed in copending U.S. Pat. Application, Ser. No. 737,134, for "Temperature-Compensated Voltage Regulator" by Stephen C. Kwan, filed on Oct. 29, 1976, and assigned to the assignee of the present invention. The reference voltage $V_{REF}$ (1.2 volts in this embodiment) is coupled to the positive (+) input of scaling operational amplifier 10 and reference operational amplifier 11.

The temperature is sensed by thermistor $R_T$ (which, in other embodiments, may be substituted for by light-sensitive devices; such as, photo resistors for light level measurement, or transducer devices for measurement of mechanical stress; such as, pressure or tension) which is coupled between the $V_A$ output of scaling operational amplifier 10 and the negative (−) input of amplifier 10.

Scaling amplifier 10 produces voltage $V_A$ which varies according to the temperature or other parameter being measured. Reference amplifier 11 has a constant resistance internal resistor R4 coupled between its output and its negative (−) input to provide voltage $V_B$ representing the full-scale value of the parameter being measured. Amplifiers 10 and 11 are illustrated in detail in the circuit diagram of FIG. 2i. Referring then to FIG. 2i, the base of transistor 343 provides the positive (+) input and the base of transistor 344 provides the negative (−) input of scaling amplifier 10; the base of transistor 345 provides the positive (+) input and the base of transistor 346 provides the negative (−) input of reference amplifier 11. Transistors 349 and 350, in essence, provide the output of amplifiers 10 and 11, respectively, to switch 13. Analog switch 13 allows either voltage $V_A$ output from amplifier 10 or voltage $V_B$ output from amplifier 11 to be applied by means of transistor 351 and resistor $R_0$ to the negative (−) input of integrator 14. Switch 13, shown in FIG. 2j, is selectively enabled by switch driver 28 and operates to ground the collectors of either transistor 349 or transistor 350. The output of amplifier with the non-grounded transistor will be transferred to integrator 14. Switch driver 28, which is comprised of NAND gates 352 and 353, receives selection signals $E_0$ from three-state counter 26 via one of three decoder 27.

Figure 2E:
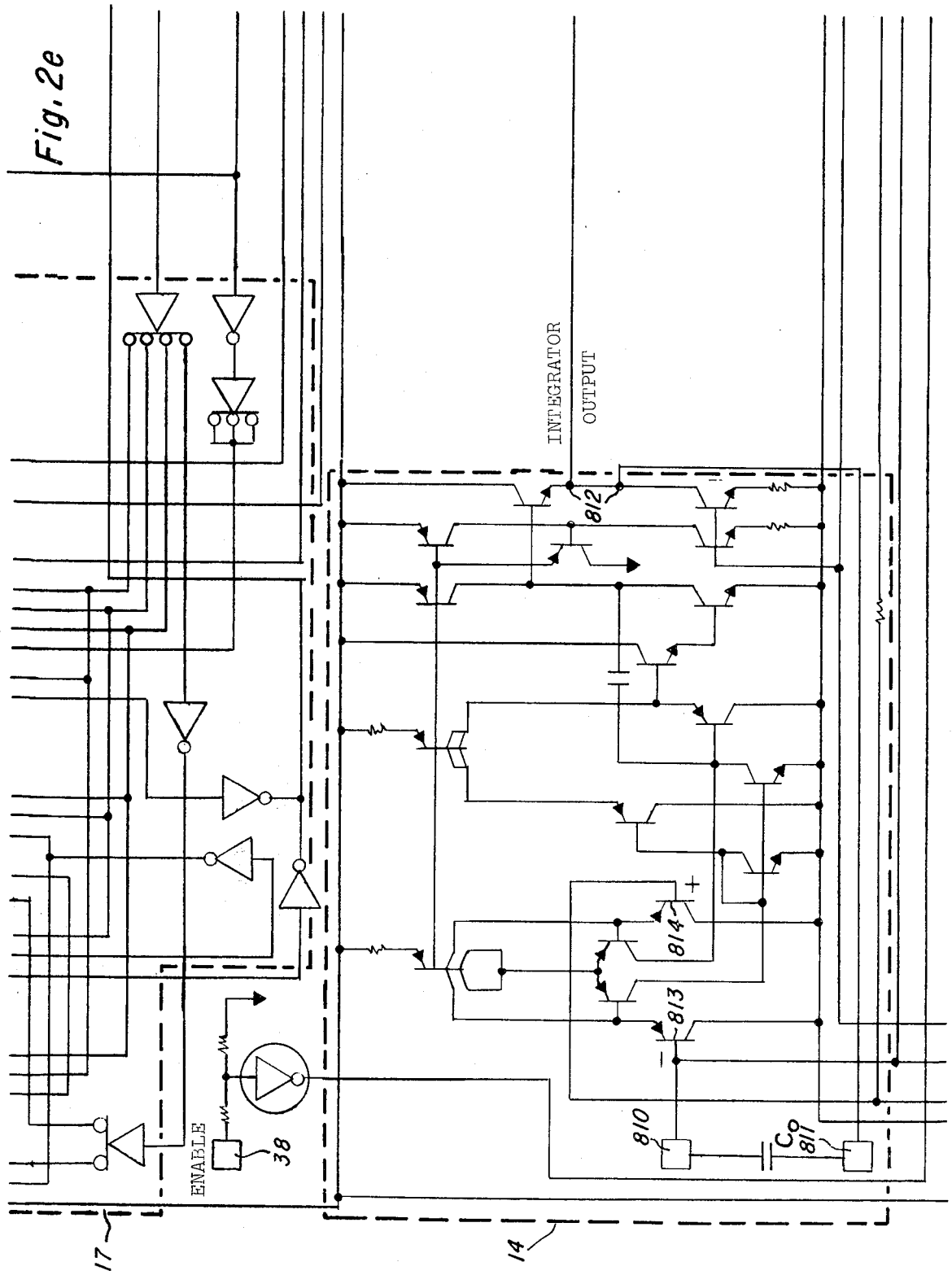
Figure 2F:
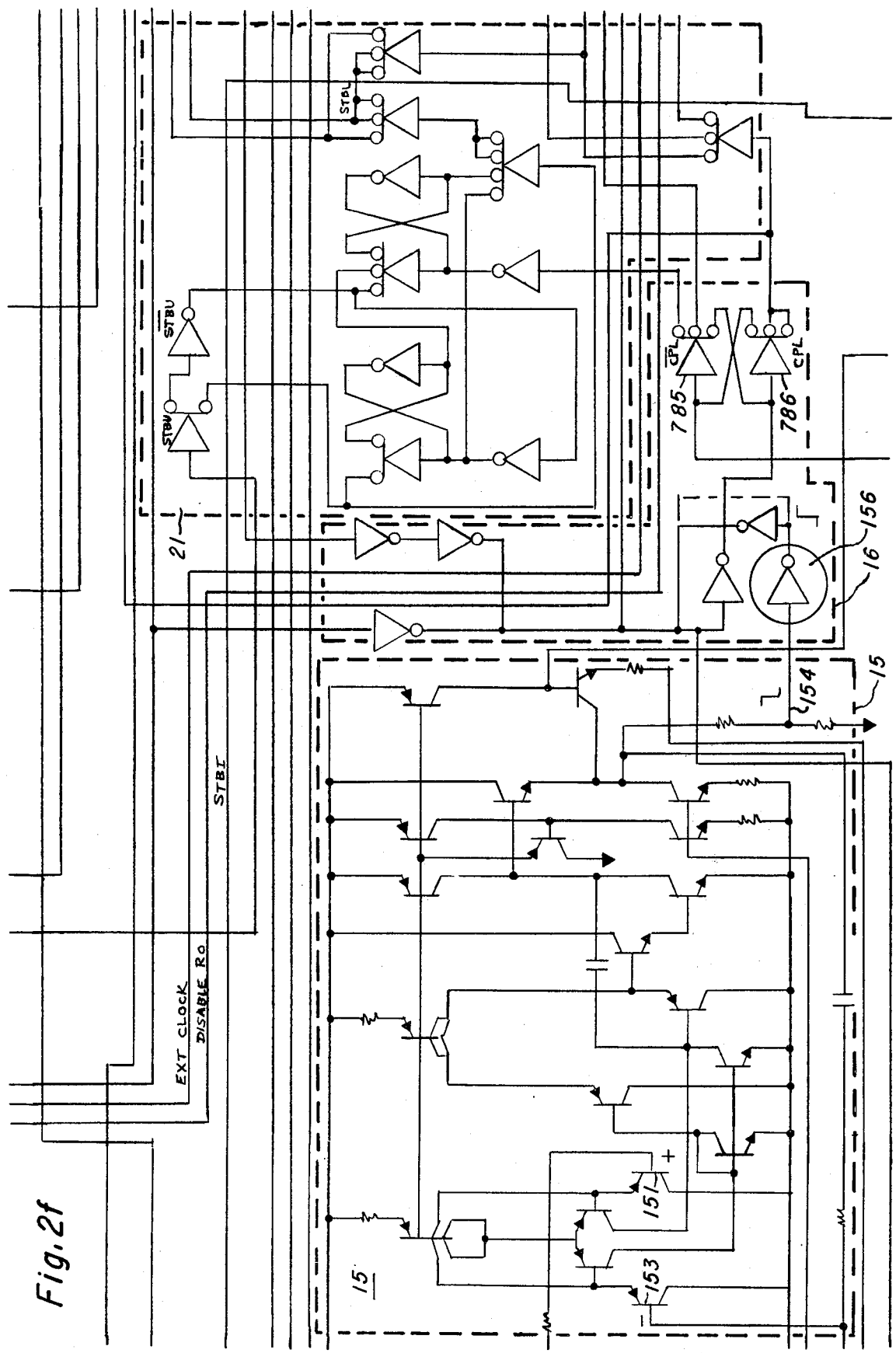
Figure 2J:
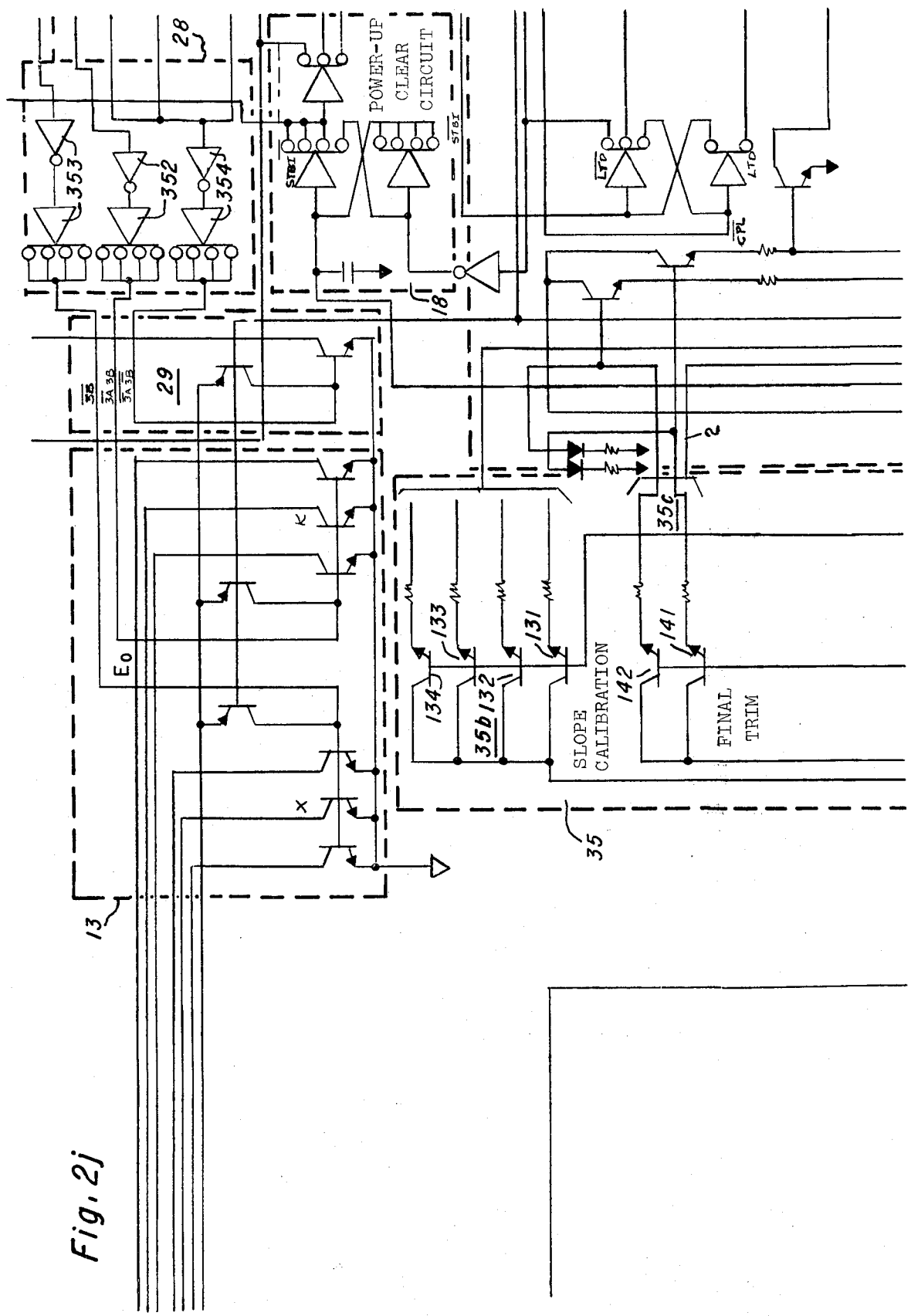
Figure 2M:
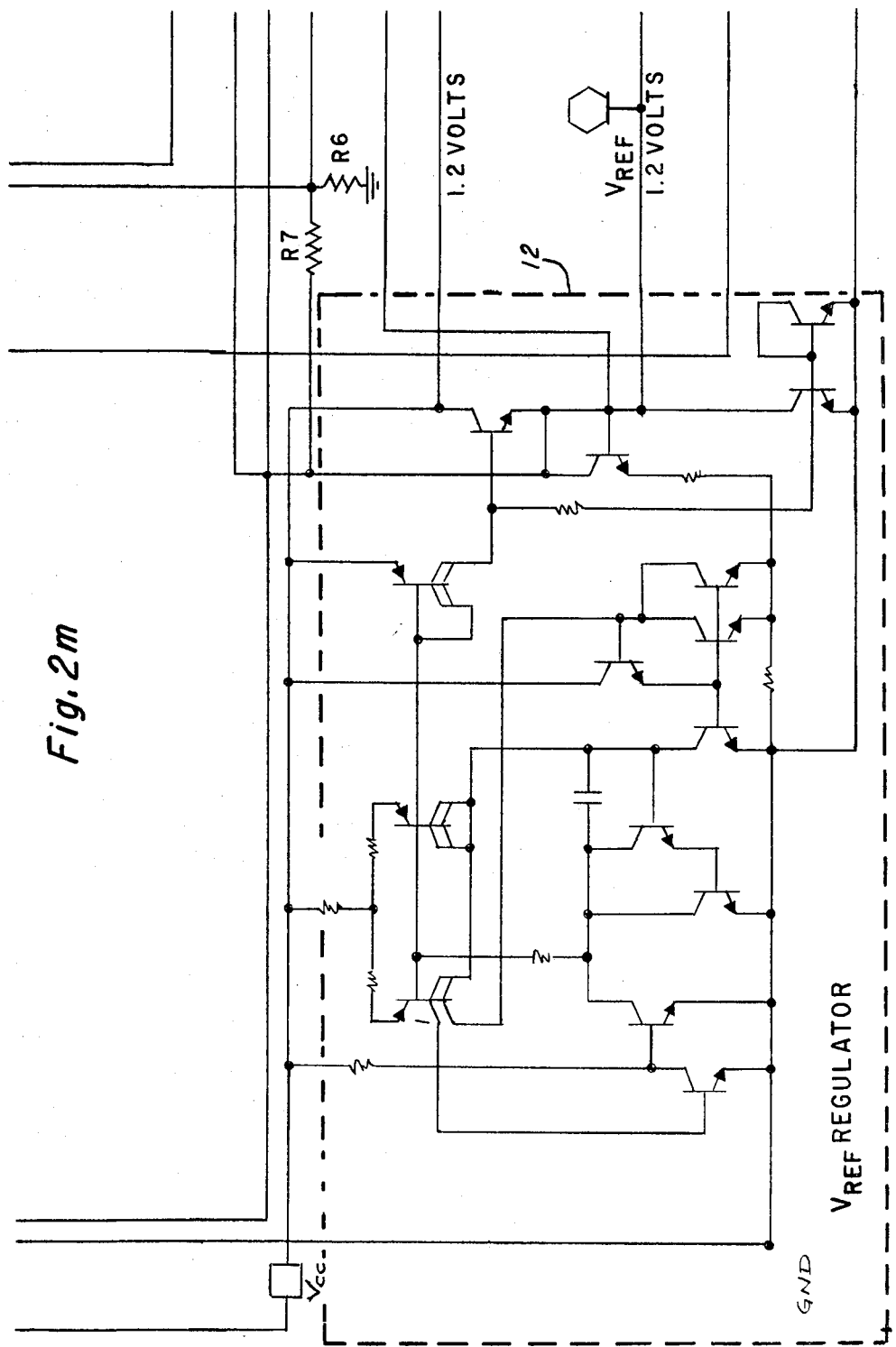

Integrator 14, which is illustrated in detail in FIG. 2e, produces a ramp voltage in one direction (e.g., positive) when the voltage $V_A$ is applied via resistor $R_0$ to the negative (−) input and produces a ramp voltage in the opposite (e.g., negative) direction when the voltage $V_B$ is applied via resistor $R_0$ to the negative (−) input. An integration capacitor $C_0$ is connected between output 812 of integrator 14 (at terminal 811) and its negative (−) input (at terminal 810) provided by the base of transistor 813. The base of transistor 814 provides the positive (+) input of integrator 14. The output 812 of integrator 14 is coupled to the positive (+) input provided by the base of transistor 151 of analog comparator 15 shown in detail in FIG. 2f.

The negative (−) input of comparator 15, provided by the base of transistor 153, is coupled to receive $V_{REF}$. Comparator 15 produces a logical transition at output 154 when the input signal at the base of transistor 151 crosses the threshold in either direction (positive to negative or negative to positive). Detection of this transition by isolated (non-current injected) NAND gate 156 trips comparator latch 16 which stores the information that the transition has occurred. Comparator latch 16 is comprised of cross-coupled NAND gates 785 and 786.

The output of comparator 15 is selectively fed back to the negative (−) input of integrator 14 by means of switch 29. Switch 29, illustrated in detail in FIG. 2j, is enabled by NAND gates 354 of switch driver 28 in a similar manner to switch 13 in order to discharge capacitor $C_0$ at the appropriate time during each analog-to-digital conversion cycle.

Input signal scaling of the analog-to-digital converter is provided through selection of input resistors RT and $R_1$–$R_9$. RT is the external thermistor or other condition-sensing device coupled between terminals 347 and 348. $R_1$ is an external analog input gain-setting resistor coupled between terminal 347 and ground; the remaining resistors $R_2$–$R_9$ may be and are preferably integrated on the semiconductor substrate to avoid excessive external components.

The digital section of the digital thermometer is comprised of current injection logic ($I^2L$) which operates from the same voltage supply as the analog section described above. All of the gates (represented by triangles in FIGS. 2a–2p) are NAND gates; the collector outputs (represented by circles at the point of the triangles) are shown for each gate.

The digital section includes a ring oscillator 17 which produces clock pulses (CLK) for the system and three scanning signals (I, II and III) and is shown in detail in FIGS. 2a and 2e.

Referring then to FIGS. 2a and 2e, ring oscillator 17 is comprised of a plurality of cascaded NAND gates 501–509 coupled in a ring configuration to achieve a plurality of astable states. Thus, the output of each of the gates 501–508 is respectively connected to the input of the next gate 502–509 in the cascade and the output of gate 509 is coupled to the input of the gate 501 to complete the ring configuration. The system clock which typically runs at 20 kHz, is taken from the outputs of NAND gates $R_1$, $R_3$, $R_5$ and $R_7$ which are NAND'd by NAND gate 810 according to the equation $CK = \overline{R_1 \cdot R_3 \cdot R_5 \cdot R_7}$. The output of NAND gate 810 is applied to the base of driver transistor 524 and by the collector of transistor 524 to flip-flop circuit 801. Flip-flop circuit 801 provides the clock signal for the rest of the digital circuitry.

A unique feature of oscillator circuit 17 is that provision is made for frequency adjustments by lead pattern selection in the fabrication process to provide discrete variations in oscillator injector current levels. Lowering injector currents increases delay time between each of the astable states provided by NAND gates 501–509, and, therefore, results in a lower clock frequency. In the illustrated embodiment seventy-two discrete adjustments in frequency are available. The ranges are: MAX $I_{LOW\,INJ} = 3/13\, I_{HIGH\,INJ}$; MIN $I_{LOW\,INJ} = 1/24 \times 1/13\, I_{HIGH\,INJ}$ (i.e., 3 MAX to 1/24 MIN) where: $I_{HIGH\,INJ}$ is the injector current of the $I^2L$ gates in the rest of the digital circuitry of the system, and $I_{LOW\,INJ}$ is the injector current of the $I^2L$ gates in the ring oscillator chain. These adjustments can best be understood from the following description of the current biasing utilized in the digital thermometer. $I^2L$ gate 528 is comprised of a 25-collector transistor connected as a current sink. The injector of transistor 528 is biased from the main system current injector 900 (shown in FIG. 2n), which provides, for example, 10 μA per gate. Collector 804 is utilized to sink current and the other 24 collectors 805 are selectively utilized in the feedback connection to the input of gate 528. The single sink collector 804 will sink from 1/24th of the 10 μA (with all collectors 805 are connected in the feedback) to 10 μA (with only one collector 805 connected in the feedback).

The parallel connection of transistors 525 and 526 provides eight collectors, each biased at 1/24th of 10 μA to 10 μA. Transistor 527, a high-gain substrate PNP, is utilized to compensate for the low-gain of transistors 525 and 526 by providing a path for their base current to ground.

In the illustrated embodiment, three of the eight collectors of transistors 526 are coupled together at 523 to provide drive current A to drive the injectors of the nine I²L gates 501-509 comprising the ring oscillator and NAND gate 810. Thus, the injector current, realized by gate 528, undergoes division by 24, multiplication by 3 and division by 10; this is the current at which ring oscillator gates 501-509 are biased. The factors 24 and 3 are adjustable in integral steps making a division ratio of 1/24 to 3 possible by selective connection in the fabrication process of the collectors of transistors 525, 526 and 527, as required.

In the digital thermometer, adjustable oscillator frequency is important to optimize the circuit for maximum sensitivity and accuracy and for compensation of the circuit for inaccuracies in device parameters which are process dependent, and not completely and accurately calculable, and thus, not under direct control. This technique, along with its obvious modifications, namely, varying the number of collectors on both the transistor of gate 528 and parallel transistors 525 and 526, is considered broader in application than the digital thermometer; it is applicable to all circuits which utilize an I²L ring oscillator that is integrated on the same substrate as other I²L circuitry, the oscillator being of low cost and yet adjustable within a high degree of accuracy.

In the embodiment of the ring oscillator illustrated in FIGS. 2a and 2e, the clock signal rate is reduced to about 2 kHz by flip-flops 201-204 comprising tenths decode counter 19a, shown in FIGS. 2b and 2c. The output of D₀ counter flip-flop 204 is input to flip-flops 802 and 803 of oscillator circuit 17 to provide display multiplexing signals I, II and III which are applied to display multiplexer circuit 22a and digit drivers 25.

Figure 4:
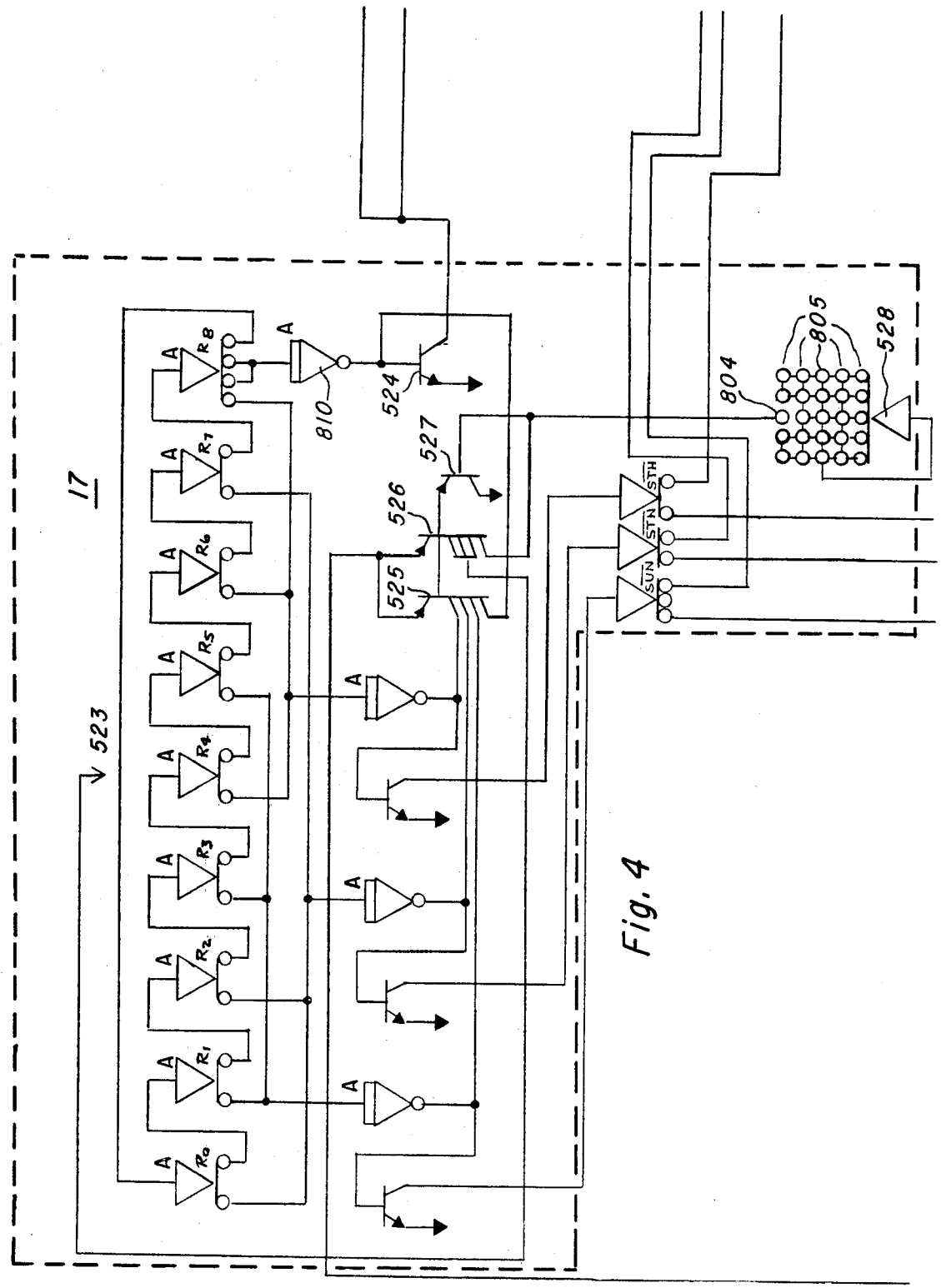
FIG. 4 is a circuit diagram of an alternate embodiment of the oscillator utilized in the analog-to-digital converter of the digital thermometer.

In an alternate embodiment, the multiplexing signals I, II and III are derived directly from the ring counter along with the system clock signal as illustrated in FIG. 4. The resulting circuit operates as indicated in Table I below. The system clock signal is taken from $R_8$, the output of gate 509, which provides a 50% duty cycle. Scan outputs I, II and III, for three-phase scanning, are derived as follows: $I = \overline{R_1 \cdot R_3 \cdot R_5}$; $II = \overline{R_2 \cdot R_4 \cdot R_6}$ and $III = \overline{R_0 \cdot R_2 \cdot R_7}$.

TABLE I

| STATE | RING OSCILLATOR OUTPUTS | | | | | | | | | | SCANNING SIGNALS | | |
|---|---|---|---|---|---|---|---|---|---|---|---|---|---|
| | $R_0$ | $R_1$ | $R_2$ | $R_3$ | $R_4$ | $R_5$ | $R_6$ | $R_7$ | $R_8$ | $R_0$ | I | II | III |
| 0 | 0 | 1 | 0 | 1 | 0 | 1 | 0 | 1 | 0 0 | 0 | 1 | 1 |
| 1 | 1 1 | 0 | 1 | 0 | 1 | 0 | 1 | 0 | 1 | 0 | 1 | 1 |
| 2 | 1 | 0 0 | 1 | 0 | 1 | 0 | 1 | 0 | 1 | 1 | 1 | 1 |
| 3 | 1 | 0 | 1 1 | 0 | 1 | 0 | 1 | 0 | 1 | 1 | 1 | 0 |
| 4 | 1 | 0 | 1 | 0 0 | 1 | 0 | 1 | 0 | 1 | 1 | 1 | 0 |
| 5 | 1 | 0 | 1 | 0 | 1 1 | 0 | 1 | 0 | 1 | 1 | 1 | 0 |
| 6 | 1 | 0 | 1 | 0 | 1 | 0 0 | 1 | 0 | 1 | 1 | 1 | 0 |
| 7 | 1 | 0 | 1 | 0 | 1 | 0 | 1 1 | 0 | 1 | 1 | 1 | 0 |

TABLE I-continued

| STATE | RING OSCILLATOR OUTPUTS | | | | | | | | | | SCANNING SIGNALS | | |
|---|---|---|---|---|---|---|---|---|---|---|---|---|---|
| | $R_0$ | $R_1$ | $R_2$ | $R_3$ | $R_4$ | $R_5$ | $R_6$ | $R_7$ | $R_8$ | $R_0$ | I | II | III |
| 8 | 1 | 0 | 1 | 0 | 1 | 0 | 1 | 0 0 | 1 | 1 | 1 | 1 |
| 9 | 1 | 0 | 1 | 0 | 1 | 0 | 1 | 0 | 1 1 | 1 | 0 | 1 |
| 10 | 0 0 | 1 | 0 | 1 | 0 | 1 | 0 | 1 | 0 | 1 | 0 | 1 |
| 11 | 0 | 1 1 | 0 | 1 | 0 | 1 | 0 | 1 | 0 | 1 | 0 | 1 |
| 12 | 0 | 1 | 0 0 | 1 | 0 | 1 | 0 | 1 | 0 | 1 | 0 | 1 |
| 13 | 0 | 1 | 0 | 1 1 | 0 | 1 | 0 | 1 | 0 | 1 | 0 | 1 |
| 14 | 0 | 1 | 0 | 1 | 0 0 | 1 | 0 | 1 | 0 | 1 | 1 | 1 |
| 15 | 0 | 1 | 0 | 1 | 0 | 1 1 | 0 | 1 | 0 | 0 | 1 | 1 |
| 16 | 0 | 1 | 0 | 1 | 0 | 1 | 0 0 | 1 | 0 | 0 | 1 | 1 |
| 17 | 0 | 1 | 0 | 1 | 0 | 1 | 0 | 1 1 | 0 | 0 | 1 | 1 |
| 0 | 0 | 1 | 0 | 1 | 0 | 1 | 0 | 1 | 0 0 | 0 | 1 | 1 |

Dead time during states 2, 8 and 14 prevents "ghosting" of the display elements caused by overlapping digit multiplexing signals. The advantage of this embodiment is that the flip-flops 801-803 are eliminated and reduce the total surface area required for the oscillator circuit.

Ring oscillator 17 is coupled to a binary-coded-decimal counter having two-and-a-half stages, tenths-decade counter 19a, units-decade counter 19b and tens counter (flip-flop) 19c. The decade counters provide two functions: first, the counters are decoded at various stages to provide system timing, and second, the counters generate the digital equivalent of the sensor parameter value which, in the embodiment of the digital thermometer, is the digital equivalent of the temperature sensed by thermistor $R_T$.

As previously discussed, comparator 15 produces a logical transition when the signal applied to the positive (+) input terminal thereof crosses the threshold voltage in either direction. Each time the transition occurs, comparator latch 16 is tripped, thereby storing the information that the transition has occurred. The output of comparator latch 16 is coupled to strobe generator 21. Strobe generator 21, illustrated in detail in FIG. 2f, also receives scanning signals I and II, and operates to strobe latches 20a-20c at the appropriate time to store the results of a present conversion from counters 19a-19c, respectively. The results of the conversion, stored in latches 20a-20c, is then decoded and displayed while the analog-to-digital converter portion of the system proceeds to make the next conversion. The unique counting scheme utilized in accordance with a novel feature of the digital thermometer, will now be described in detail.

Figure 3B:
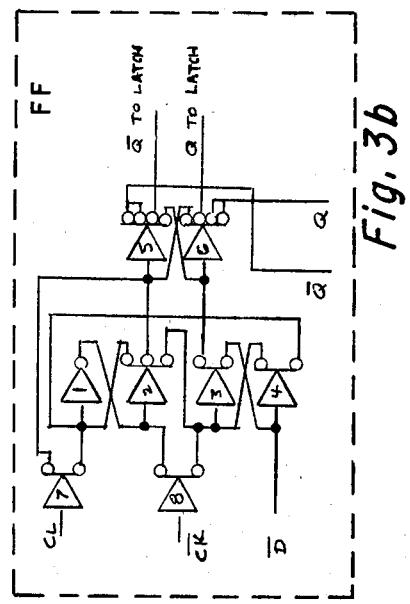
FIG. 3b is a circuit diagram of the flip-flop circuits of FIGS. 2a–2p.
Figure 3A:
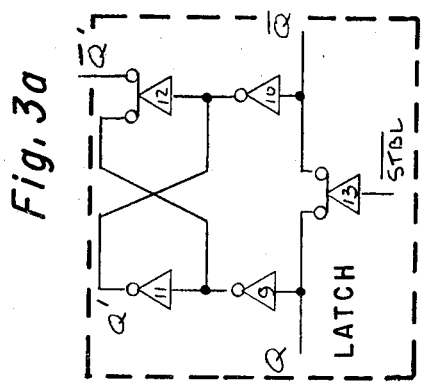
FIG. 3a is a circuit diagram of the latch circuits of FIGS. 2a–2p.

Tenths decade counter 19a is comprised of flip-flop circuits 201-204, units decade counter 19b is comprised of flip-flop circuits 301-304 and tens counter 19c is comprised of flip-flop circuit 203, each of the flip-flop circuits being identical to the flip-flop circuit of FIG. 3b. The output $A_0B_0C_0D_0$ of tenths counter 19a is decoded by means of tenths decode circuit 31a, shown in detail in FIGS. 2b and 2c; the output $A_1B_1C_1D_1$ of units decade counter 19b is decoded by units decode circuit 31b, shown in detail in FIGS. 2c and 2d; and, the output $A_2$ of tens counter (flip-flop) 19c, is decoded by tens decode circuit 21c, shown in detail in FIG. 2d.

Three-state counter 26 is utilized to generate three instantaneous states of the analog-to-digital converter. Counter 26, shown in detail in FIG. 2g, is comprised of flip-flop circuits 701 and 702, each of the flip-flop circuits being identical to the flip-flop circuit illustrated in FIG. 3b. The duration of the clock signal applied to counter 26 during any particular state is governed by clock gate circuitry 12 which is coupled to the clock ($\overline{CK}$) input of flip-flops 701-702. The output of flip-flop circuits 701 and 702 are decoded by a one-of-three decoder circuit 27 to generate the three operating states $T_0$, $T_1$ and $T_2$. During the time period $T_0$, capacitor $C_0$ is being discharged. The discharging of capacitor $C_0$, as previously discussed, is accomplished by controlling switch 29 which is coupled to the $T_0$ output of decoder circuit 27 by means of switch driver circuit 28. During the state $T_1$, integration progresses with voltage $V_A$ being applied to the input to integrator 14, and during state $T_2$, integration progresses with voltage $V_B$ being applied to the input to integrator 14. Switch 13, which controls the application of the voltage $V_A$ or $V_B$ to the input of integrator 14 is controlled by enable signal $E_0$ which is derived from decoder 27 to control switch 13 to input voltage $V_A$ during state $T_1$ and voltage $V_B$ during state $T_2$.

Unlike standard dual slope analog-to-digital converters which divide the states within a conversion sequence into three equal time periods (i.e., $T_0=T_1=T_2$), each being equal to the time required to count through all of the states of a digital counter, a counting scheme is utilized in the present system which is uniquely selected for each application. Firstly, the duration of each of the states $T_0$, $T_1$ and $T_2$ is individually selected to best suit the application, and may encompass a different number of counts of the counter, and therefore, be of different duration from one another. Secondly, the minimum measured parameter value may be given other than by the number 000 in order to best suit the application. In order to best understand the count scheme, the following exemplary discussion will be limited to the digital thermometer application, and more particularly, to a digital fever thermometer having a range limited to 95°-108.5° F., or 35°-42.5° C.

Decade counters 19a-19c, which count to 200 states in the present embodiment, are capable of resolution to one part in 200; however, for thermometer application, each count is selected to represent 0.1° and the resolution is restricted below 1 in 200 parts to accommodate both Fahrenheit and Centigrade units. Considerable reduction in circuit components results in utilizing the count ranges indicated in Table II below.

TABLE II

| | Fahrenheit | Centigrade |
|---|---|---|
| $T_0$ Count Range | 000-114 | 000-174 |
| No. of Counts in $T_0$ State | 115 | 175 |
| $T_1$ Count Range | 115-049 | 175-049 |
| No. of Counts in $T_1$ State | 135 | 75 |
| $T_2$ Count Range | 050-000 | 050-000 |
| No. of Counts in $T_2$ State | 150 | 150 |
| Temperature Range | 95.0°-108.5° F. | 35.0°-42.5° C. |
| Scale Range | 13.5° F. | 7.5° C. |

Two models may be provided utilizing the identical circuitry; a Fahrenheit model and a Centigrade model, or a single model incorporating the circuit may be provided which includes a selection switch to change from Fahrenheit to Centigrade scale. The change is accomplished by gate 33 which causes clock gating circuit 32 to alter the number of counts in the $T_1$ mode in the respective models. Two passes through the counter states (a total of 400 counts) is made; count 050 on the second pass (actually the 250th clock pulse in a conversion cycle) is utilized for minimum scale in both °F. and °C. models. Temperature range and scale range are the same in both models considering absolute temperature. However, resolution is closer in Fahrenheit than in Centigrade by the ratio of 1.8 to 1.0; the resolution is acceptable in both models because the resolution of 0.1° C. is well within the requirements for a fever thermometer, and the convenience of relating one counter state to 0.1° in both the °F. and °C. system is very desirable. Higher resolutions may, of course, be accomplished by increasing the total number of counts provided by the counter.

The system parameters, selected in TABLE I for a fever thermometer, namely, 050 count for minimum scale and 0.1° increments for each count, also provide simplification of the circuitry which would otherwise be required for decoding the results of the conversion for a decimal display. The last two digits in the results of each conversion directly represent the desired last two digits to be displayed in both the Centigrade and Fahrenheit models; for example, count 050 represents 95.0° F. or 35.0° C.; 099 represents 99.9° F. or 39.9° C.; count of 125 represents 102.5° F. and 42.5° C.; etc. Another scheme which may be utilized in accordance with the invention would be to indicate the minimum temperature of 35.0° C. (which is equal to 95.0° F.) by a count of 350 (or 950 for °F.).

The above counting scheme is accomplished in the present embodiment by decoding selected state from counters 19a-19 c in decoder circuits 31a-31c, and applying the decoded signals, along with an indication of the present state $T_0$, $T_1$ or $T_2$ from decoder circuit 27, to clock gating circuit 32. Clock gating circuit 32, illustrated in detail in FIG. 2g, is comprised of NAND gates 771-779 which receive the above-indicated signals and provide a controlled clock signal to the clock (CK) input of latch circuits 701 and 702 comprising three-state counter 26. Overrange flip-flop 761, illustrated in detail in FIG. 2h, comprises overrange circuitry 30 which is capable of detecting an overrange condition in both °C. and °F., overrange circuitry 30 being responsive to °C./°F. selection circuitry 33 and to the decoded output from decoder circuits 31a-31c. Overrange circuitry 30 is arranged to provide a predetermined display (e.g., all digits except hundreds blanked) by the occurrance of an overrange condition. Tens encoder circuitry 34, also illustrated in detail in FIG. 2h, encodes the tens digit information derived from tens flip-flop 19c and stored in latch 20c and, the overrange information derived from flip-flop 761, to provide the binary coded decimal equivalent of the tens digit $A_2B_2C_2D_2$. As previously mentioned, the tenths binary coded decimal digit $A_0B_0C_0D_0$ is stored in tenths latches 20a and the binary coded units digit $A_1B_1C_1D_1$ is stored in units latches 20b. The binary coded decimal bits comprising the tenths, units, and tens digits are then multiplexed by multiplex circuitry 22a which is controlled by scanning signals I, II and III from oscillator circuitry 17. Thus, during the period in which signal I is being applied to NAND gate 280, the binary coded decimal equivalent of the tenths digit is applied via gates 219-222 to the four inputs of decoder 22b; during the period in which signal II is being applied to NAND gate 380, the binary coded decimal equivalent of the units digit is applied via NAND gates 319-322 to the four inputs of decoder 22b; and, during the period in which state III is being applied to NAND gate 480, the tens binary coded decimal digit generated by encoder circuit 34 is applied via gates 419-422 to the four inputs of decoder circuit 22b.

Figure 2N:
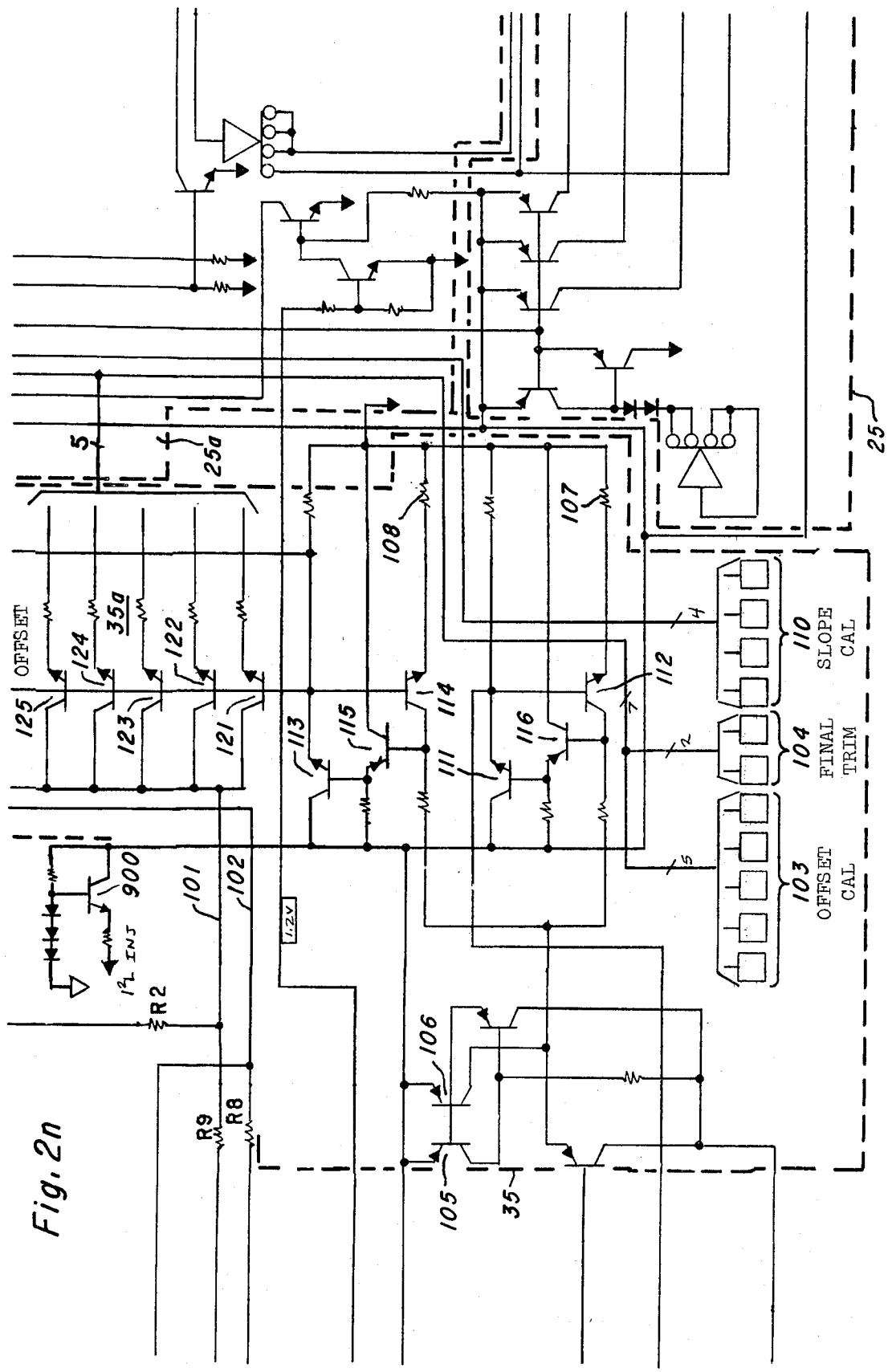
Figure 20:
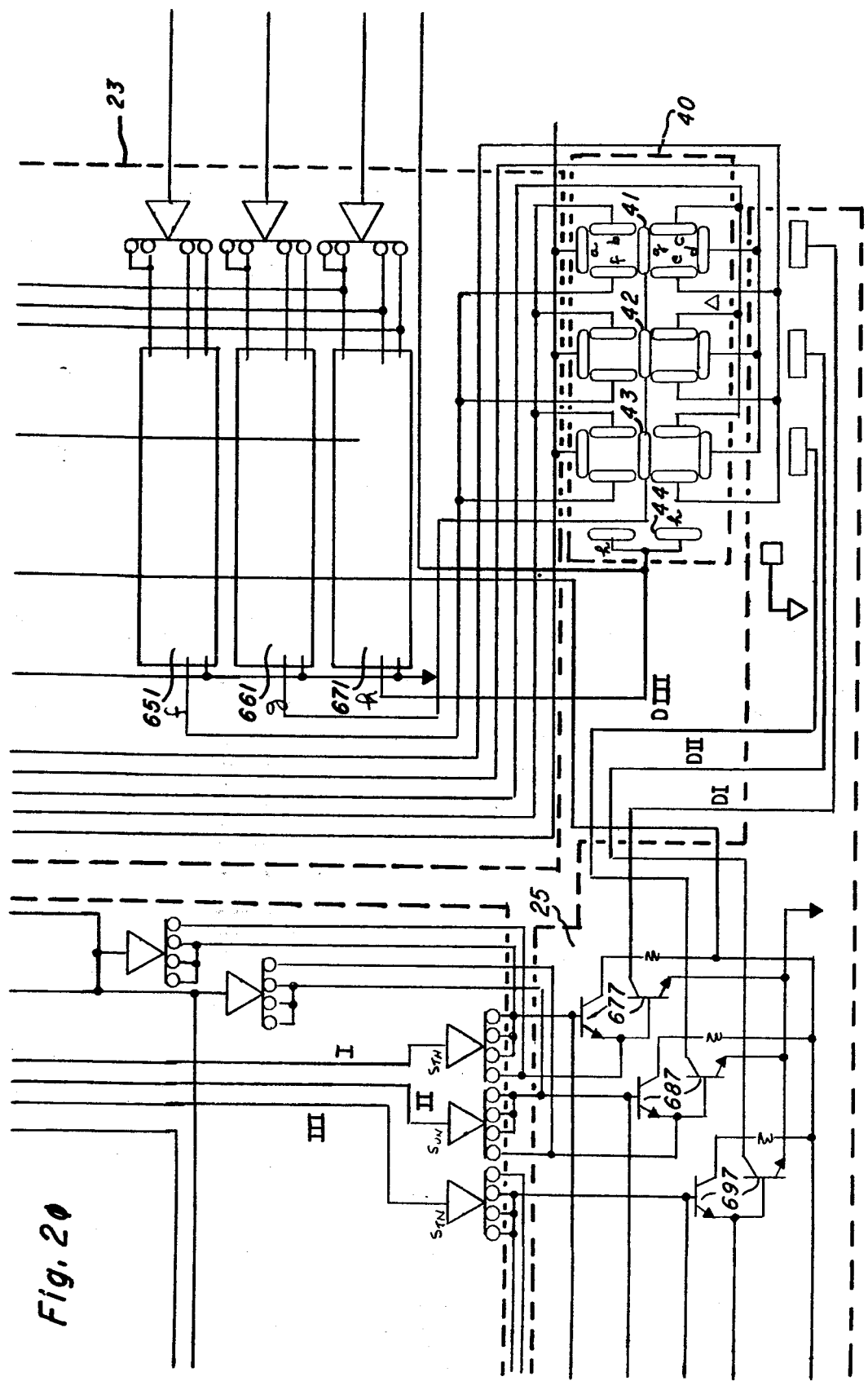
Figure 2P:
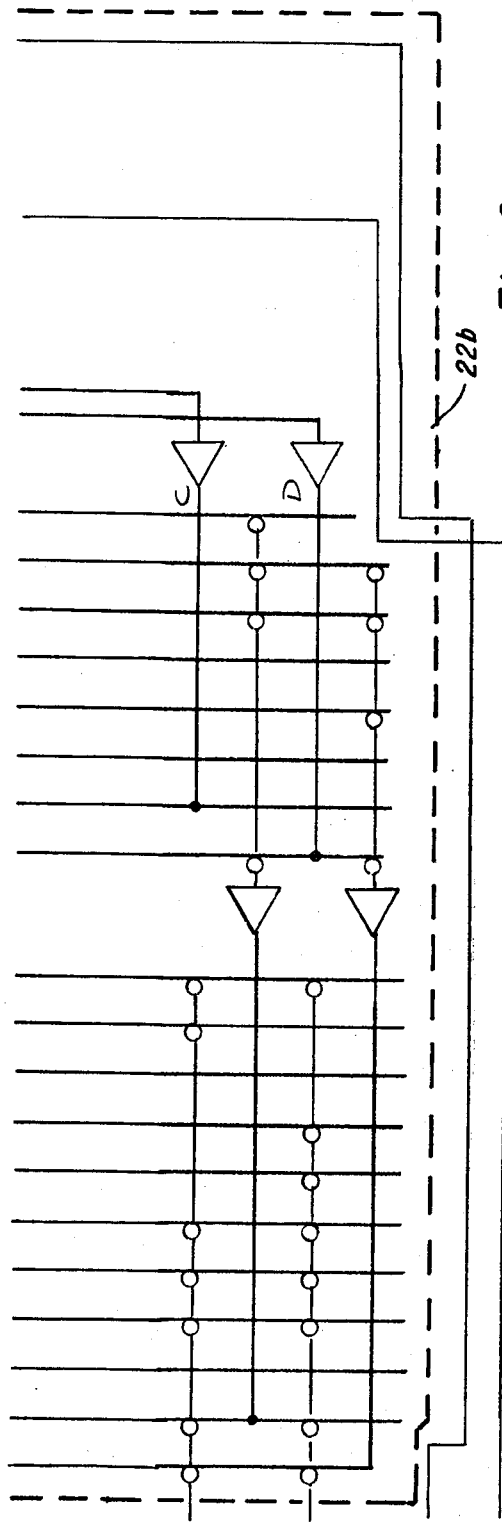

Decoder circuit 22b, illustrated in detail in FIGS. 21 and 2p, is a 4-line binary coded decimal to one-of-ten line decoder.

The ten lines providing the output of decoder 22b are coupled to the inputs of one-of-ten to seven-segment decoder and segment driver circuit 23. Decoder circuits 22b and 23, in combination, therefore, convert one of the tenths, units or tens digits from binary coded decimal to seven segment format. The scanning signals I, II and III, which are applied to multiplexer circuit 22a, are also applied to digit drivers 25 comprised of driver transistor pairs 677, 687 and 697, respectively. Driver transistors 677, 687 and 697 provide digit driver signals DI, DII and DIII to drive the seven-segment display digits; such as, LED-type display digits 41-43, respectively. The two-segment hundredths digit 44 is driven directly by decoder circuit 67, and controlled by overrange circuitry 30. Thus, since the corresponding segments of the tenths, units, and tens digits 41-43 of display 40 are wired together at the LED anodes, for example, digit drivers 677-697 apply appropriate (ground) signals DI, DII and DIII to the cathodes to allow only the desired digit simultaneously selected by multiplexing circuit 22a to be energized both under control of scanning signals I, II and III.

The analog-to-digital conversion circuit is capable of making a continuous series of conversions in the digital thermometer embodiment, however, after the first conversion, thermistor $R_T$ is cooling down, and any reading derived therefrom would be erroneous; therefore, only the first conversion is accepted. Display latch 25a, illustrated in detail in FIGS. 2n and 2o, is initialized to keep the display off with low battery drain until a first conversion is received. When latch circuit 25a is tripped by comparator latch 16, the display is turned on and further conversions are rejected.

As previously mentioned, two models °C. and °F. are provided by the illustrated circuit. A single connection to transistor 880 of select gating circuit 33, shown in detail in FIG. 2h, converts the °C. range to the °F. range. Where a hardwire is utilized, in accordance with a unique feature of an embodiment of the invention, the selection is made automatically. °C. is automatically selected by connecting a three-digit display (tens, units and tenths) for a range of 35° C.–42.5° C., and °F. is automatically selected when a four-digit display is connected to the circuit (hundredths, tens, units and tenths) for a range of 95° F. to 108.5° F.; the emitter of transistor 880 being coupled to the circuit terminal pins which receive hundredths segments 44 of display 40.

A unique feature of the above-described digital thermometer is that all of the component circuits: operational amplifiers 10 and 11, integrator 14 and analog comparator 15, as well as all of the digital circuitry, operate from a single low-voltage, low-power voltage supply. The single reference voltage utilized by all of the analog circuits is internally generated from the single low-power voltage supply. Where $V_{CC}$ is provided by, for example, a 5-volt (e.g., battery) supply, power consumption somewhat less than 50 mW for the entire circuit (not including the display drive power which varies according to the particular display utilized) is achievable.

Another unique feature of the digital thermometer is the provision made for calibration of the analog circuits. Calibration is accomplished by unique stepwise calibration circuit 35, illustrated in detail in FIGS. 2j and 2n. Calibration circuit 35 makes use of binary weighted current sinks (or sources) which may be activated in any combination by selective connection to sets 103, 104 and 110 of calibration terminals provided at a convenient point on the integrated circuit chip and/or through pins on the integrated circuit package. Three types of calibration are provided in the present embodiment. Offset calibration circuit 35a adjusts the zero scale value of the unknown parameter; slope calibration circuit 35b adjusts the full scale of the unknown parameter; and final trim circuit 35c adjusts the assembled digital thermometer for correct measurements to a bath of known standard temperature. No external components are required for calibration, only grounded or open circuit calibration terminals or pins. The usual problems encountered by analog circuits with potentiometer calibration are avoided (ie, drift from the calibrated condition).

Transistors 105, 106 and 111-116 are connected to provide a current sufficient to bias transistors 121-125, 131-134 and 141-142 at a particular current level. Resistors 107 and 108 provide current feedback for circuit stabilization and a voltage drop which is related to downward ratioing of successive current sinks in the binary weighted string. In this embodiment, eleven current sinks are provided: five, 121-125, for offset calibration; two, 141-142, for final trim and four, 131-134, for slope calibration. Offset current sinks 121-125 and trim current sinks 141-142, are collectively biased from the base of transistor 112; slope current sinks 131-134 are biased from the base of transistor 114.

Offset current sinks transistors 121-125 are of successively smaller geometry so that approximately equal emitter-base voltage drops, at currents successively smaller by a factor of two, are maintained. Similar geometry adjustments are made in transistors 131-134 and 141-142, respectively. An example of emitter current and resistance values for the eleven current sources for one embodiment of the digital thermometer are shown in TABLE III.

TABLE III

| | TRANSISTOR CURRENT SOURCE REF. NUMBER | EMITTER RESISTOR VALUE | EMITTER CURRENT |
|---|---|---|---|
| OFFSET | 121 | 625 ohms | 160 µA |
| | 122 | 1250 ohms | 80 |
| | 123 | 2500 ohms | 40 |
| | 124 | 5000 ohms | 20 |
| | 125 | 10000 ohms | 10 |
| SLOPE | 131 | 625 ohms | 160 µA |
| | 132 | 1250 ohms | 80 |
| | 133 | 2500 ohms | 40 |
| | 134 | 5000 ohms | 20 |
| TRIM | 141 | 5000 ohms | 20 µA |
| | 142 | 10000 ohms | 10 |

Current sources 121-125, 131-134 and 141-142 of each calibration set, are individually selectively activated by grounding the terminals of the various emitter resistors which are each connected to a pin of the external sets of pins 103, 104 and 110, respectively. Thus, for offset calibration, the five IC package pins coupled to the set of terminals 103 provide 32 discrete conditions from zero to 310 µA in 10-µA steps. For calibration, the four IC package pins, coupled to terminals 110, allow sixteen steps from 10 to 300 µA in 20-µA steps. For final trim, the two package pins, coupled to terminals 104, provide four steps, 0 to 30 μA in 10-μA steps. These parameters are, of course, pertinent only to the example of TABLE III; it is obvious that any number of variations may be provided resulting in any desired number of calibration steps and current variations per step.

Offset and trim currents are summed at the collectors of the selected ones of transistors 121–125 and 141–142, and flow through resistor R9; slope currents are summed at the collectors of the selected ones of transistors 131–134, and flow through resistor R8. The other terminal of resistors R8 and R9 are connected to a 1.2-volt reference voltage provided by $V_{REF}$ regulator 12. The respective voltage drops across resistors R8 and R9 are then adjusted voltages programmed by external pin connections; these adjustable voltage drops are then respectively applied to operational amplifier circuits 10 and 11 to effect the desired calibration adjustments.

As previously discussed, the above-described system incorporates an analog-digital integrated circuit fabricated on a single semiconductor substrate. The analog and digital circuitry, being comprised of bipolar devices, are fabricated utilizing standard I²L technology. A P-type substrate having a P+ buried layer and an N-type epitaxial layer of between 0.2–0.3 mils (nominally about 0.25 mils) in thickness on the surface thereof is utilized.

The novel features of the invention have now been described in detail with respect to preferred embodiments thereof. Since it is obvious that many changes and modifications can be made in the above details without departing from the nature and spirit of the invention, it is understood that the invention is not to be limited to said details except as set forth in the appended claims.

What is claimed is:

1. A single chip integrated dual slope analog-to-digital converter circuit comprising:
   (a) first terminal means for receiving a relatively low voltage potential, wherein said integrated circuit operates entirely from a single voltage potential applied to said first terminal means;
   (b) second terminal means for receiving analog input signals;
   (c) scaling amplifier means coupled to said first and second terminal means for generating a first voltage which is a representation of received analog input signals;
   (d) reference amplifier means coupled to said first terminal means for generating a second voltage representative of the full scale of the received analog input signals;
   (e) integrator means having input and output means and means for coupling an integration capacitor thereto, said integrator means for generating a ramp voltage in one direction when said first voltage is applied to the input means thereof and for generating a ramp voltage in the opposite direction when said second voltage is applied to the input means thereof;
   (f) controllable switch means for selectively applying either said first or second voltage to the input means of said integrator;
   (g) comparator means coupled to the output means of said integrator means and to said first terminal means for producing a logical transition signal when said integrator ramp voltage crosses a threshold voltage in either direction;
   (h) triggerable storage means coupled to said comparator means, and responsive to said transition signal for storing an indication of the occurrence thereof;
   (i) digital counter means for generating a digital count;
   (j) means coupled to said counter means, and responsive to the indication stored in said triggerable storage means for storing said digital count upon the occurrence of said transition signal, said storage digital count being a digital representation of the analog input signals applied to said second terminal means;
   (k) voltage regulator means coupling said first terminal means to said scaling amplifier means, said reference amplifier means, said integrator means and said comparator means for regulating the low-voltage reference potential applied to each of said means.

2. The analog-to-digital converter circuit according to claim 1, wherein the integrator circuit is comprised of bipolar transistor circuitry.

3. The analog-to-digital converter circuit according to claim 1, wherein said counter means and said means for storing the count of said counter means are comprised of current injection logic digital circuitry.

4. The analog-to-digital converter circuit according to claim 3, wherein said counter means and said means for storing the count of said counter means are coupled to said first terminal means, and are powered by said low-voltage potential.

5. The analog-to-digital converter circuit integrated circuit according to claim 1, wherein said circuitry is integrated in an N-type epitaxial layer on a P-type substrate.

6. The analog-to-digital converter integrated circuit according to claim 5, wherein said epitaxial layer is between 0.2 and 0.3 mils in thickness.

7. The analog-to-digital converter circuit according to claim 6 including decoder means coupled to said counter means for controlling said controllable switch means.

8. The analog-to-digital converter circuit according to claim 1 including second controllable switch means coupled to said means for receiving an integration capacitor to said integrator, and said triggerable storage means for discharging said integration capacitor to initialize said converter.

9. The analog-to-digital converter circuit according to claim 8 including decoder means coupled to said counter means for controlling said second controllable switch means.

10. The analog-to-digital converter circuit according to claim 1, wherein said single voltage potential is on the order of 5 volts or less.

11. A single chip integrated dual slope analog-to-digital converter circuit comprising:
   (a) first terminal means for receiving a relatively low voltage potential, wherein said integrated circuit operates entirely from a single voltage potential applied to said first terminal means;
   (b) regulator means coupled to said first terminal means for producing a reference voltage which does not substantially vary with changes in ambient conditions;
   (c) second terminal means for receiving analog input signals;
   (d) scaling amplifier means coupled to said regulator means and to said second means for generating a first voltage which is a representation of received analog input signals;

(e) reference amplifier means coupled to said regulator means for generating a second voltage representative of the full scale of the received analog input signals;

(f) integrator means coupled to said regulator means and having input and output means, said integrator means for generating a ramp voltage in one direction when said first voltage is applied to the input means thereof and for generating a ramp voltage in the opposite direction when said second voltage is applied to the input means thereof;

(g) controllable switch means for selectively applying either said first or second voltage to the input means of said integrator;

(h) comparator means coupled to the output means of said integrator means and to said regulator means for producing a logical transition signal when said integrator ramp voltage crosses a threshold voltage in either direction;

(i) triggerable storage means coupled to said comparator means, and responsive to said transition signal for storing an indication of the occurrence thereof;

(j) digital counter means for generating a digital count; and (k) means coupled to said counter means, and responsive to the indication stored in said triggerable storage means for storing said digital count upon the occurrence of said transition signal, said stored digital count being a digital representation of the analog input signals applied to said second terminal means.

12. The analog-to-digital converter circuit according to claim 11, wherein the integrator circuit is comprised of bipolar transistor circuitry.

13. The analog-to-digital converter circuit according to claim 11, wherein said counter means and said means for storing the count of said counter means are comprised of current injection logic digital circuitry.

14. The analog-to-digital converter circuit according to claim 13, wherein said counter means and said means for storing the count of said counter means are coupled to said first terminal means, and are powered by said low-voltage potential.

15. The analog-to-digital converter circuit integrated circuit according to claim 11, wherein said circuitry is integrated in an N-type epitaxial layer on a P-type substrate.

16. The analog-to-digital converter circuit according to claim 15, wherein said epitaxial layer is between 0.2 and 0.3 mils in thickness.

17. The analog-to-digital converter circuit according to claim 16 including decoder means coupled to said counter means for controlling said controllable switch means.

18. The analog-to-digital converter circuit according to claim 11 including second controllable switch means coupled to said integrator means, and said triggerable storage means for discharging an integration capacitor coupled to said integrated analog-to-digital converter to initialize said converter.

19. The analog-to-digital converter according to claim 18 including decoder means coupled to said counter means for controlling said second controllable switch means.

20. The analog-to-digital converter circuit according to claim 11, wherein said single voltage potential is on the order of 5 volts or less.

* * * * *